(12) United States Patent
Hirao et al.

(10) Patent No.: US 7,838,410 B2
(45) Date of Patent: Nov. 23, 2010

(54) METHOD OF ELECTRICALLY CONNECTING ELEMENT TO WIRING, METHOD OF PRODUCING LIGHT-EMITTING ELEMENT ASSEMBLY, AND LIGHT-EMITTING ELEMENT ASSEMBLY

(75) Inventors: Naoki Hirao, Kanagawa (JP); Yasunobu Iwakoshi, Tokyo (JP); Katsuhiro Tomoda, Kanagawa (JP); Huy Sam, Tokyo (JP)

(73) Assignee: Sony Corporation, Tokyo (JP)

( * ) Notice: Subject to any disclaimer, the term of this patent is extended or adjusted under 35 U.S.C. 154(b) by 181 days.

(21) Appl. No.: 12/163,636

(22) Filed: Jun. 27, 2008

(65) Prior Publication Data

US 2009/0014748 A1    Jan. 15, 2009

(30) Foreign Application Priority Data

Jul. 11, 2007 (JP) ............................ 2007-181727
Oct. 5, 2007 (JP) ............................ 2007-261974

(51) Int. Cl.
*H01L 21/44* (2006.01)

(52) U.S. Cl. ................... 438/608; 438/91; 438/602; 438/604; 257/E21.006; 257/E21.051; 257/E21.077; 257/E21.085; 257/E21.126; 257/E21.127; 257/E21.304; 257/E21.328; 257/E21.347

(58) Field of Classification Search .............. 438/20, 438/91, 509, 513, 602, 603, 604, 680, 681, 438/692, 733, 686, 687, 688, 781, 782; 257/E21.006, 257/17, 126, 127, 51, 77, 85, 304, 328, 347
See application file for complete search history.

(56) References Cited

U.S. PATENT DOCUMENTS

| | | | |
|---|---|---|---|
| 2004/0013249 A1 | 7/2004 | Kim et al. | |
| 2007/0295973 A1* | 12/2007 | Jinbo et al. | ................ 257/88 |
| 2008/0050851 A1* | 2/2008 | Tanaka et al. | ................ 438/29 |
| 2008/0050895 A1* | 2/2008 | Miyairi et al. | .............. 438/507 |

FOREIGN PATENT DOCUMENTS

| | | |
|---|---|---|
| JP | 10-228249 | 8/1998 |
| JP | 11-117148 | 4/1999 |
| JP | 2000-315453 | 11/2000 |
| JP | 2004-215223 | 7/2004 |
| JP | 2005-317941 | 11/2005 |
| JP | 2006-135236 | 5/2006 |
| JP | 2006-147648 | 6/2006 |
| JP | 2006-165506 | 6/2006 |
| JP | 2008-135518 | 6/2008 |
| WO | 2008/078478 | 7/2008 |

\* cited by examiner

*Primary Examiner*—David Nhu
(74) *Attorney, Agent, or Firm*—K & L Gates LLP

(57) ABSTRACT

A method of electrically connecting an element to wiring includes the steps of forming a conductive fixing member precursor layer at least on wiring provided on a base; and arranging an element having a connecting portion on the wiring such that the connecting portion contacts the conductive fixing member precursor layer, and then heating the conductive fixing member precursor layer to form a conductive fixing member latter, thereby fixing the connecting portion of the element to the wiring, with the conductive fixing member layer therebetween, wherein the conductive fixing member precursor layer is composed of a solution-tape conductive material.

26 Claims, 13 Drawing Sheets

FIG. 2A

| SECOND ELECTRODE (CONNECTING PORTION) |
|---|
| LIGHT-EMITTING LAYER |
| SUBSTRATE FOR ELEMENT PRODUCTION |

FIG. 2B

| SUBSTRATE FOR ELEMENT PRODUCTION |
|---|
| LIGHT-EMITTING LAYER |
| SECOND ELECTRODE (CONNECTING PORTION) |
| RELAY SUBSTRATE |

FIG. 2C

| LIGHT-EMITTING LAYER |
|---|
| SECOND ELECTRODE (CONNECTING PORTION) |
| RELAY SUBSTRATE |

FIG. 2D

| FIRST ELECTRODE |
|---|
| LIGHT-EMITTING LAYER |
| SECOND ELECTRODE (CONNECTING PORTION) |
| RELAY SUBSTRATE |

FIG. 2E

| RELAY SUBSTRATE |
|---|
| SECOND ELECTRODE (CONNECTING PORTION) |
| LIGHT-EMITTING LAYER |
| FIRST ELECTRODE |
| SUPPORTING SUBSTRATE |

FIG. 2F

| SECOND ELECTRODE (CONNECTING PORTION) |
|---|
| LIGHT-EMITTING LAYER |
| FIRST ELECTRODE |
| SUPPORTING SUBSTRATE |

FIG. 2G

| SUPPORTING SUBSTRATE |
|---|
| FIRST ELECTRODE |
| LIGHT-EMITTING LAYER |
| SECOND ELECTRODE (CONNECTING PORTION) |
| CONDUCTIVE FIXING MEMBER PRECURSOR LAYER |
| WIRING |
| BASE |

FIG. 2H

| FIRST ELECTRODE |
|---|
| LIGHT-EMITTING LAYER |
| SECOND ELECTRODE (CONNECTING PORTION) |
| CONDUCTIVE FIXING MEMBER PRECURSOR LAYER |
| WIRING |
| BASE |

[STEP-100]

[STEP-110]

CONTINUATION OF [STEP-110]

CONTINUATION OF [STEP-110]

[STEP-120]

CONTINUATION OF [STEP-120]

CONTINUATION OF [STEP-120]

CONTINUATION OF [STEP-120]

[STEP-130]

CONTINUATION OF [STEP-130]

[STEP-140]

[STEP-150]

[STEP-530]

[STEP-540]

[STEP-550]

US 7,838,410 B2

METHOD OF ELECTRICALLY CONNECTING ELEMENT TO WIRING, METHOD OF PRODUCING LIGHT-EMITTING ELEMENT ASSEMBLY, AND LIGHT-EMITTING ELEMENT ASSEMBLY

CROSS REFERENCES TO RELATED APPLICATIONS

The present application claims priority to Japanese Patent Application JP 2007-261974 filed in the Japanese Patent Office on Oct. 5, 2007, the entire contents of which are incorporated herein by reference.

BACKGROUND

The present application relates to a method of electrically connecting an element to wiring, a method of producing a light-emitting element assembly, and a light-emitting element assembly.

Recently, anisotropic conductive paste (ACP) has been often used in, for example, a method of electrically connecting a light-emitting element to wiring or the like (refer to, for example, Japanese Unexamined Patent Application Publication Nos. 11-177148 and 2004-215223). Anisotropic conductive pastes generally contains conductive particles, a binder, and a solvent. Electrical connection of a light-emitting element to wiring or the like can be performed by applying anisotropic conductive paste, then drying the paste, and performing thermocompression bonding.

SUMMARY

When the size of an element, such as a light-emitting element, is reduced to about several tens of micrometers or less, the ratio of the size of a conductive particle contained in anisotropic conductive paste to the size of the element becomes relatively high. Consequently, as schematically shown in FIG. 13A, an element is not electrically connected to wiring reliably. Moreover, as schematically shown in FIG. 13B, this mats result in an element being inclined on wiring. In addition, when unwanted portions of the anisotropic conductive paste are removed, a binder contained in the anisotropic conductive paste easily remains as a residue. Furthermore, in using anisotropic conductive paste, it is necessary to apply a pressure to the paste while an external stimulus such as a temperature or light is applied. Accordingly, it is difficult to uniformly fix a very, small element on wiring.

Japanese Unexamined Patent Application Publication No. 2000-315453 discloses a technique in which a cathode material composed of isotropic carbon is fixed on a substrate using an ITO ink. However, in the technique disclosed in Japanese Unexamined Patent Application Publication No. 2000-315453, after isotropic carbon is fixed on a substrate using an ITO ink, a complex process of patterning is then performed using a resist as a mask for etching to remove unwanted isotropic carbon and ITO ink.

It is desirable to provide a method of electrically connecting an element to wiring in which an element or a light-emitting element can be fixed on wiring provided on a base using a conductive layer for fixing so as to reliably achieve electrical connection and/or in which a complex process, such as a patterning of the conductive layer using a resist as a mask for etching, is not be performed. It is desirable to provide a method of producing a light-emitting element assembly using the above-mentioned method of electrical connection, and a light-emitting element assembly produced using the above-mentioned method of electrical connection.

A method of electrically connecting an element to siring according to a first embodiment includes the steps of (A) forming a conductive fixing member precursor layer at least on wiring provided on a base; and (B) arranging an element having a connecting portion on the wiring such that the connecting portion contacts the conductive fixing member precursor layer, and then heating the conductive fixing member precursor layer to form a conductive fixing member layer, thereby fixing the connecting portion of the element to the wiring, with the conductive fixing member layer therebetween, wherein the conductive fixing member precursor layer is composed of a solution-type conductive material.

A method of producing a light-emitting element assembly according to a first embodiment includes the steps of (A) forming a conductive fixing member precursor layer at least on wiring provided on a base; and (B) arranging a light-emitting element having a connecting portion on the wiring such that the connecting portion contacts the conductive fixing member precursor layer, and then heating the conductive fixing member precursor layer to form a conductive fixing member layer, thereby fixing the connecting portion of the light-emitting element to the wiring, with the conductive fixing member layer therebetween, wherein the conductive fixing member precursor layer is composed of a solution-type conductive material.

A method of electrically connecting an element to wiring according to a second embodiment includes the steps of (A) forming a conductive fixing member precursor layer on a connecting portion provided on an element; and (B) arranging the element on wiring provided on a base such that the conductive fixing member precursor layer contacts the wiring, and then heating the conductive fixing member precursor layer to form a conductive fixing member layer, thereby fixing the connecting portion of the element to the wiring, with the conductive fixing member layer therebetween, wherein the conductive fixing member precursor layer is composed of a solution-type conductive material.

A method of producing a light-emitting element assembly according to a second embodiment includes the steps of (A) forming a conductive fixing member precursor layer on a connecting portion provided on a light-emitting element; and (B) arranging the light-emitting element on wiring provided on a base such that the conductive fixing member precursor layer contacts the wiring, and then heating the conductive fixing member precursor layer to form a conductive fixing member layer, thereby fixing the connecting portion of the light-emitting element to the wiring, with the conductive fixing member layer therebetween, wherein the conductive fixing member precursor layer is composed of a solution-type conductive material.

A light-emitting element assembly according to a first embodiment includes a light-emitting element having a connecting portion, a base, wiring provided on the base, and a conductive fixing member layer, wherein the connecting portion of a light-emitting element and the wiring are fixed using the conductive fixing member layer disposed therebetween, the conductive fixing member layer is disposed only under the light-emitting element, and the conductive fixing member layer is made of ITO or IZO.

A light-emitting element assembly according to a second embodiment includes a light-emitting element having a connecting portion, a base, wiring provided on the base, and a conductive fixing member layer, wherein the connecting portion of a light-emitting element and the wiring are fixed using the conductive fixing member layer disposed therebetween, and the conductive fixing member layer contains at least a metal atom, a carbon (C) atom, and an oxygen (O) atom.

As described above, in the light-emitting element assembly according to the second embodiment, the conductive fixing member layer contains a metal atom, a carbon (C) atom, and an oxygen (O) atom. For example, the carbon (C) atom content is in the range of 3 to 30 weight percent.

Examples of the metal atom include indium (In), tin (Sn), zinc (Zn), a combination of indium (In) and tin (Sn), and a combination of indium (In) and zinc (Zn). Examples of the metal atom further include metalloid atoms, semiconductor atoms, and combinations of these atoms. In addition to a metal atom, a carbon (C) atom, and an oxygen (O) atom, the conductive fixing member layer may contain a hydrogen (H) atom.

In the method of electrically connecting an element to wiring according to the first embodiment or the method of producing a light-emitting element assembly according to the first embodiment (hereinafter, the method may be simply generically referred to as "method according to a first embodiment"), in step (A), the conductive fixing member precursor layer may be formed on the base including the top surface of the wiring, and the method may further include a step of leaving a portion of the conductive fixing member layer located under the element or the light-emitting element (hereinafter, element or light-emitting element is generically referred to as "element or the like") by removing other portions of the conductive fixing member layer, the step being performed after step (B).

In the method according to the first embodiment including the above-described preferred feature, in step (B), the element or the like may be arranged on the wiring by removing the element or the like from a substrate in a state in which the connecting portion provided on the element or the like supported (alternatively, formed or held) on the substrate is in contact with the conductive fixing member precursor layer.

In the method of electrically connecting an element to wiring according to the second embodiment or the method of producing a light-emitting element assembly according to the second embodiment (hereinafter, the method may be simply generically referred to as "method according to a second embodiment"), in step (B), the element or the like may be arranged on the wiring by removing the element or the like from a substrate in a state in which the conductive fixing member precursor latter formed on the connecting portion provided on the element or the like supported (alternatively, formed or held) on the substrate is in contact with the wiring provided on the base. In this case, the step of forming a conductive fixing member precursor layer on a connecting portion provided on an element or the like is preferably performed after the element or the like is supported on the substrate.

In the method according to the first embodiment or the method according to the second embodiment (hereinafter, the method may be simply generically referred to as "method according to an embodiment") including the above-described preferred features, preferably, the conductive fixing member precursor layer does not contain fine particles having a particle diameter exceeding $1 \times 10^{-7}$ m. When such fine particles having a particle diameter exceeding $1 \times 10^{-7}$ m are not contained the element or the like can be electrically connected to the wiring reliably, and a problem of inclination of the element or the like on the wiring can be reliably prevented.

Furthermore, in the method according to an embodiment including the above-described preferred features, and the light-emitting element assembly according to the first or second embodiment (hereinafter, the light-emitting element assembly is simply generically referred to as "light-emitting element assembly according to an embodiment"), the conductive fixing member layer may be made of indium tin oxide (ITO) or indium zinc oxide (IZO). However, the material of the conductive fixing member layer is not limited thereto. The conductive fixing member layer may be made of a conductive material obtained using a metal alkoxide, a metal complex, or a metal salt as a starting material.

Furthermore, in the method according to an embodiment including the above-described various preferred features, by performing a beat treatment during step (B) or after step (B), a metal constituting the wiring and a metal constituting the conductive fixing member layer may be alloyed, a metal constituting the connecting portion of the element or the like and a metal constituting the conductive fixing member layer may be alloyed, or a metal constituting the wiring and a metal constituting the conductive fixing member layer may be alloyed and a metal constituting the connecting portion of the element or the like and a metal constituting the conductive fixing member layer may be alloyed. Accordingly, a more stable connection between the wiring and the connecting portion of the element or the like can be achieved, and long-term reliability of the connecting portion of the element or the like and the portion of the wiring can be improved. Furthermore, in the case where a portion of the conductive fixing member layer is removed, by forming such an alloy, for example, an etching selectivity can be changed between an alloyed portion of the conductive fixing member layer and other portions of the conductive fixing member layer which have not been alloyed. Consequently, a portion of the conductive fixing member layer can be easily removed. Examples of metals that can be used include silver (Ag), gold (Au), indium (In), tin (Sn), and copper (Cu); alloys containing these metal elements; and alloys composed of metals selected from aluminum (Al), molybdenum (Mo), nickel (Ni), lead (Pb), and palladium (Pd). In this case, a metal layer for alloying may be formed in an area of a projection image of the element or the like that is vertically projected on the base. The outer edge of the projection image of the element or the like that is vertically projected on the base may correspond to the outer edge of the metal layer. Alternatively, the outer edge of the metal layer may be included in the outer edge of the projection image. The outer edge of the projection image may be included in the outer edge of the metal layer in some cases. In this case, considering variations during the production, when the area surrounded by the outer edge of the metal layer is represented by "1", the area surrounded by the outer edge of the projection image is preferably represented by "0.80 to 0.99". Examples of the metal constituting the metal layer include silver (Ag), gold (Au), indium (In), tin (Sn), titanium (Ti), and alloys containing these metals. Similarly, in the light-emitting element assembly according to an embodiment, a metal constituting the wiring and a metal constituting the conductive fixing member layer is preferably alloyed, a metal constituting the connecting portion of the light-emitting element and a metal constituting the conductive fixing member layer is preferably alloyed, or a metal constituting the wiring and a metal constituting the conductive fixing member layer is preferably alloyed and a metal constituting the connecting portion of the light-emitting element and a metal constituting the conductive fixing member layer is preferably alloyed. The metal layer may be formed on the wiring or between the base and the wiring. For the sake of convenience, the heat treatment for the purpose of alloying may be referred to as "heat treatment for allowing".

Examples of the base used in the method according to an embodiment or the light-emitting element assembly according to an embodiment include a glass substrate, a metal substrate, a metal sheet, an alloy substrate, an alloy, sheet, a ceramic substrate, a ceramic sheet, a semiconductor substrate, a plastic substrate, a plastic sheet, and a plastic film. Specific examples of the plastic film include a polyethersulfone (PES) film, a polyethylene naphthalate (PEN) film, a polyimide (PI) film, and a polyethylene terephthalate (PET) film. Examples of the base further include a substrate prepared by bonding the above film to a glass substrate, and a glass substrate having a polyimide resin layer, an acrylic resin layer, a polystyrene resin layer, or a silicone rubber layer thereon. Alternatively, the glass substrate may be replaced with a metal substrate or a plastic substrate. Examples of the base further include a substrate prepared by forming an insulating film on the surface of any of the above-mentioned substrate. Here, examples of the material of the insulating film include inorganic insulating materials such as silicon oxide materials, silicon nitrides ($SiN_Y$), and metal oxide high dielectric insulating films; and organic insulating materials such as polymethylmethacrylate (PMMA), polyvinylphenol (PVP), and polyvinyl alcohol (PVA). These insulating materials may be used in combinations. Examples of the silicon oxide materials include silicon oxides ($SiO_X$), silicon oxynitride (SiON), spin-on-glass (SOG), and low-dielectric constant $SiO_X$ materials (such as polyaryl ethers, cycloperfluorocarbon polymers, benzocyclobutene, cyclic fluorocarbon resins, poly-tetrafluoroethylene, fluorinated aryl ethers, fluorinated polyimides, amorphous carbon, and organic SOG). Examples of a method of forming the insulating film include PVD methods, CVD methods, a spin coating method, printing methods, coating methods, an immersion method, a casting method, and a spray method. These methods will be described below.

A pattern of wiring formed on the base can be appropriately determined on the basis of a desired specification. For example, the wiring pattern may be composed of a plurality of wirings each extending in the form of a strip. Alternatively, the wiring pattern may be composed of a main wiring and a plurality or branch wirings extending from the main wiring, and elements or the like may be fixed on the branch wirings. Examples of the material constituting the wiring formed on the base include above-mentioned metals such as silver (Ag), gold (Au), indium (On), tin (Sn), and copper (Cu); alloys containing these metal elements; alloys composed of metals selected from aluminum (Al), molybdenum (Mo), nickel (Ni), lead (Pb), and palladium (Pd); metals such as aluminum (Al), palladium (Pd), platinum (Pt), chromium (Cr), nickel (Ni), tantalum (Ta), tungsten (W), and titanium (Ti); alloys containing these metal elements; conductive particles made of any one of these metals; and conductive particles made of an alloy containing these metal elements. Alternatively, the wiring may have a laminated structure including layers containing these elements. The method of forming the wiring depends on the material constituting the wiring. Examples of the method include physical vapor deposition methods (PVD methods), chemical vapor deposition methods (CVD methods) such as a metalorganic chemical vapor deposition (MOCVD) method; printing methods such as a screen printing method, an inkjet printing method, an offset printing method, a gravure printing method, a contact printing method, and an imprint method; a lift-off method; a shadow mask method; and plating methods such as an electrolytic plating method, an electroless plating method, and a combination of these methods. These methods may be employed in combination with a patterning technique, if necessary. Examples of the PVD methods include (a) vacuum deposition methods such as an electron beam heating method, a resistance heating method, and a flash evaporation method, (b) a plasma-deposition method; (c) sputtering methods such as a diode sputtering method, a DC sputtering method, a DC magnetron sputtering method, a radio-frequency (RF) sputtering method, a magnetron sputtering method, an ion beam sputtering method, and a bias sputtering method; and (d) ion plating methods such as a direct current (DC) method, an RF method, a multi-cathode method, an activated reactive method, an electric field evaporation method, an RF ion plating method, and a reactive ion plating method.

Examples of the method of forming the conductive fixing member precursor layer include a spin coating method; printing methods such as a screen printing method, an ink-jet printing method, an offset printing method, a gravure printing method, a contact printing method, and an imprint method; coating methods such as an air doctor coating method, a blade coating method, a rod coating method, a knife coating method, a squeeze coating method, a reverse roll coating method, a transfer roll coating method, a gravure coating method, a kiss coating method, a cast coating method, a spray coating method, a slit orifice coating method, a calender coating method, and an immersion method; a stamping method; and a spray method.

In order to form the conductive fixing member layer, the conductive fixing member precursor layer is heated. The meaning of this heating includes not only (1) heat treatment for removing a solvent and various organic substances (such as a stabilizing agent) contained in the conductive fixing member precursor layer; but also (2) pyrolysis and chemical reaction of a solution-type conductive material constituting the conductive fixing member precursor layer, the pyrolysis and the chemical reaction being caused by heating; and (3) baking of a solution-type conductive material constituting the conductive fixing member precursor layer, the baking being caused by heating.

The heating (including a heat treatment, pyrolysis, chemical reaction, and baking) may be performed in air or in an inert gas atmosphere. The atmosphere during heating, the pressure during heating, the heating time, the heating temperature, and the temperature-increasing/temperature-decreasing pattern can be appropriately determined in accordance with the material of the conductive fixing member precursor layer used. After the conductive fixing member layer is formed by heating the conductive fixing member precursor layer, annealing of the conductive fixing member layer may be performed. In the case where portions of the conductive fixing member layer located under the element or the like are left and other portions of the conductive fixing member layer (portions of the exposed conductive fixing member layer that are not covered with the element or the like) are removed, specifically, the conductive fixing member layer may be etched using an etchant or a gas for etching suitable for the conductive fixing member layer, the etchant or the gas for etching not adversely affecting the element or the like, the base, and wiring.

In the method according to an embodiment or the light-emitting element assembly according to an embodiment, specific examples of the connecting portion provided on the element or the like include an electrode, a pad portion, a wiring portion, and a terminal portion. The number of connecting portions per element or the like to be fixed to wiring is not limited to one. The number of connecting portions may be two or more. When the number of connecting portions is two or more, it is difficult to reduce the pitch of the connecting portions to 30 µm or less in the related art. In contrast, in the method according to an embodiment or the light-emitting element assembly according to an embodiment, even when the pitch of the connecting portions is about 10 μm, for example, connection using bumps can be established. The thickness of the conductive fixing member layer is, for example, in the range of $1 \times 10^{-9}$ to $1 \times 10^{-5}$ m, and preferably in the range of $5 \times 10^{-9}$ to $1 \times 10^{-7}$ m. The volume resistivity of the conductive fixing member layer is, for example, in the range of $1 \times 10$ Ω·m ($1 \times 10^3$ Ω·cm) or less. In the case where the element has a high internal resistance, for example, in the case of a light-emitting element, the volume resistivity, of the conductive fixing member layer is, for example, in the range of $1 \times 10^{-2}$ Ω·m (1 Ω·cm) to 1 Ω·m ($1 \times 10^2$ Ω·cm). Even if the volume resistivity of the conductive fixing member layer is such a high value, no problems occur because the thickness of the conductive fixing member layer is small, and the element or the like has a high internal resistance.

In the method according to an embodiment, the conductive fixing member precursor layer is composed of a solution-type conductive material. The solution-type conductive material basically contains no filler. The solution-type conductive material is composed of, for example, a material in which a colloidal substance is dispersed in a solution, the colloidal substance being prepared by hydrolyzing an alkoxide or the like and then polymerizing the hydrolyzed product. Alternatively, the solution-type conductive material is a liquid material composed of a solution prepared by dissolving an organic compound of a metal in an organic solvent, wherein for example, an oxide can be easily formed by applying the solution on an underlayer (such as wiring, a substrate, or a connecting portion), followed by drying and heating. The element or the like is arranged in such a manner that a connecting portion of the element or the like is in contact with the conductive fixing member precursor layer. The conductive fixing member precursor layer preferably has adhesiveness (i.e., tackiness) to the extent that the element or the like is not moved from the conductive fixing member precursor layer after the arrangement.

In a structure in which light emitted from a light-emitting layer is emitted from a base, wiring has a shape, a configuration, and a structure that do not interrupt the emitted light. A black matrix layer may be formed on areas of the base where the emitted light does not pass through. Examples of the material of the black matrix layer include carbon, thin films of a metal (such as chromium, nickel, aluminum, molybdenum, or an alloys thereof), a metal oxide (such as chromium oxide), a metal nitride (such as chromium nitride), heat-resistant organic resins, glass paste, and glass paste containing conductive particles such as a black pigment or silver particles. The black matrix layer can be formed by a method that is appropriately selected in accordance with the material used. For example, the black matrix layer can be formed by combining a vacuum deposition method or a sputtering method and an etching method; combining a vacuum deposition method, a sputtering method, or a spin coating method and a lift-off method; a printing method; or a lithography technique. A convex lens may be provided at a position of the base from which light is emitted. Examples of the material of the convex lens include acrylic resins, epoxy resins, and silicone rubbers. Examples of a method of forming (disposing) the convex lens include a reflow method, a potting method, an imprint method, a photolithograph), method, an etching method, and a printing method.

Examples of the light-emitting element in the method of producing a light-emitting element assembly according to an embodiment or the light-emitting element assembly according to an embodiment include a light-emitting diode (LED), a semiconductor laser, and an electroluminescent (EL) element. Examples of the element in the method of electrically connecting an element to wiring according to an embodiment include light-receiving elements such as a photodiode, a CCD sensor, and a MOS sensor; and electronic elements such as an IC chip and an LSI chip. In addition to semiconductor elements (such as light-emitting elements, light-receiving elements, and electron transit elements), examples of the elements include piezoelectric elements, pyroelectric elements, optical elements (such as second harmonic wave-generating elements including nonlinear optical crystals), dielectric elements (including ferroelectric elements), and superconducting elements. Furthermore, examples of the elements further include very small components and elements that are used for various micro electro mechanical systems (MEMS) such as an optical encoder. The dimension (for example, the chip size) of the element or the like is not particularly limited. The element or the like typically has a very small size. More specifically, the element or the like has a dimension of, for example, 1 mm or less, 0.3 mm or less, 0.1 mm or less, or 0.02 mm or less.

Examples of an electronic device produced by the method according to an embodiment or an electronic device to Which the light-emitting element assembly according to an embodiment is applied include a light-emitting diode display unit, a backlight including light-emitting diodes, a light-emitting diode lighting system, and an EL display unit. The electronic device is not particularly limited and may be a portable electronic device or a non-portable electronic device. Specific examples thereof include a cell phone, a mobile device, a robot, a personal computer, a device for automobile use, and a home electric appliance. For example, a diode composed of a nitride-based Group III-V compound semiconductor can be used as a red-light-emitting diode, a green-light-emitting diode, and a blue-light-emitting diode. For example, a diode composed of an AlGaInP compound semiconductor can be used as a red-light-emitting diode.

At present, it is difficult to produce a substrate having a large diameter exceeding nominal 2 inches as a substrate for element production on which GaInN light-emitting diodes are produced. It is also difficult to produce a substrate having a large diameter exceeding nominal 3 inches as a substrate for element production on which AlGaInP light-emitting diodes are produced. Accordingly, for example, blue-light-emitting diodes and green-light-emitting diodes are produced using a sapphire substrate having a diameter of nominal 2 inches as a substrate for element production, and red-light-emitting diodes are produced using a GaAs substrate having a diameter of nominal 3 inches as a substrate for element production. For example, in producing a light-emitting diode display unit, a predetermined number of blue-light-emitting diodes, a predetermined number of green-light-emitting diodes, and a predetermined number of red-light-emitting diodes are mounted on the basis of the specification.

For example, Japanese Unexamined Patent Application Publication Nos. 2004-273596 and 2004-281630 disclose a step transfer method as a method of producing such a light-emitting diode display unit. The method of producing a light-emitting element assembly according to an embodiment can be applied to this step transfer method. More specifically, the method of producing a light-emitting element assembly includes the following steps:

(a) A light-emitting layer composed of a laminated structure of compound semiconductor layers is formed on a substrate for element production, and a second electrode is then formed on the light-emitting layer. Thus, a laminated structure compose of the second electrode and the light-emitting layer is prepared.

(b) Subsequently, the laminated structure is bonded to a relay substrate in such a manner that the second electrode contacts the relay substrate. The substrate for element production is then removed from the light-emitting layer, and a first electrode is formed on the exposed light-emitting layer. Next; the light-emitting layer and other layers are patterned, thus separating the layers into light-emitting elements.

(c) Next, desired light-emitting elements are transferred from being disposed on the relayed substrate to being disposed on a substrate. Subsequently, the light-emitting elements are fixed on wiring of a base using the method of producing a light-emitting element assembly according to an embodiment.

(d) Subsequently, an insulating layer is formed so as to cover each of the light-emitting elements, and an opening is formed in the insulating layer located on the first electrode or the second electrode of each of the light-emitting elements. Second wiring connected to the first electrode or the second electrode is formed on the insulating layer. Note that the second electrode may correspond to a connecting portion or the first electrode may correspond to a connecting portion.

The wiring formed on the base and the second wiring are connected to a driving circuit to produce a light-emitting diode display unit. Examples of the material of the insulating layer include the above-mentioned materials of the insulating film.

Examples of the materials of the substrates and the relay substrate include a glass plate, a metal plate, an alloy plate, a ceramic plate, and a plastic plate. Examples of a method of bonding the laminated structure to the relay substrate include a method using an adhesive agent, a metal joining method, a semiconductor joining method, and a metal-semiconductor joining method. Examples of a method of removing the substrate for element production from the light-emitting layer include a laser ablation method, a heating method, and an etching method. Examples of a method of separating the resulting light-emitting layer and other layers into a plurality of light-emitting elements include a well etching method, a dry etching method, a laser irradiation method, a dicing method, a lapping method, and a chemical mechanical polishing (CMP) method. An example of a method of transferring desired elements or the like from being disposed on the relay substrate to being disposed on the substrate or a method of removing the elements or the like from the substrate is a laser irradiation method. In the case where the elements or the like are not supported on the substrate with a sufficiently high strength, the elements or the like can be removed from the substrate by means of adhesiveness (i.e., tackiness) between the elements or the like and the conductive fixing member precursor layer.

In the method according to an embodiment, since the conductive fixing member precursor layer is composed of a solution-type conductive material, the resulting conductive fixing member layer obtained by heating the conductive fixing member precursor layer does not contain large particles. Accordingly, an element or the like can be electrically connected to the wiring reliably, and a problem of inclination of the element or the like on the wiring does not occur. In addition, electrical connection can be established without applying a pressure. Furthermore, a problem of residue remaining after the removal of unwanted portions of the conductive fixing member layer does not occur.

In the method according to the first embodiment, unwanted portions of the conductive fixing member layer are removed using the element or the like as a mask for etching. In the method according to the second embodiment, the conductive fixing member later is formed only on the connecting portion provided on the element or the like. Therefore, a complex process, such as a patterning of the conductive fixing member layer using a mask for etching, is not necessary. In addition, for example, elements or the like each having a dimension of several tens of micrometers or less can be selectively fixed on wiring over a wide range. Also, in the light-emitting element assembly according to the first or second embodiment, the conductive fixing member layer prepared by heating the conductive fixing member precursor later does not contain large particles. Accordingly, an element or the like can be electrically connected to wiring reliably, and a problem of inclination of the element or the like on the wiring does not occur. In addition, electrical connection can be established without applying a pressure. Furthermore, in the method according to an embodiment or the light-emitting element assembly according to an embodiment, in the case where the conductive fixing member layer is made of ITO or IZO, the following advantages can be achieved. Specifically, since the conductive fixing member layer itself is made of an oxide, the conductivity is not degraded by heating. When the conductive fixing member layer contains a carbon atom, the adhesion can be improved and a high shear strength can be realized. Furthermore, it is sufficient to heat at a low temperature (e.g., lower than 400° C.) in some cases, and thus, thermal adverse effects on the element or the like can be reliably prevented. In addition, in the method according to the second embodiment and the light-emitting element assembly according to the second embodiment, the conductive fixing member layer is formed only on the connecting portion provided on the element or the like. Therefore, the formation of an extra conductive fixing member layer is not necessary, and thus, after electrical connection is established, the removal of such an extra conductive fixing member layer is also not necessary. Consequently, the production cost can be reduced. Furthermore, a significant advantage can be achieved in the case where elements or the like are arranged on wiring on a base at a pitch larger than a pitch of the elements or the like supported on a substrate (i.e., in the case where a step transfer method, which is a method of arranging elements or the like on wiring on a base at a pitch which is an integral multiple of a pitch of the elements or the like supported on a substrate, is employed).

Additional features and advantages are described herein, and will be apparent from the following Detailed Description and the figures.

BRIEF DESCRIPTION OF THE FIGURES

FIGS. 2A to 2H are schematic process views illustrating steps of the method of electrically connecting an element to wiring or the method of producing a light-emitting element assembly of Example 1;

DETAILED DESCRIPTION

The present application will now be described using Examples with reference the drawings according to an embodiment.

Example 1

Example 1 relates to the method of electrically connecting an element to wiring according to the first embodiment, the method of producing a light-emitting element assembly according to the first embodiment, and the light-emitting element assembly according to the first embodiment. Hereinafter, these methods are generically referred to as "method of Example 1".

In Example 1, an element or a light-emitting element is a light-emitting diode (LED) whose planar shape is a circular shape (with a diameter of 20 μm). Therefore, in the description below, the term "light-emitting diode" may be used instead of using the term "element". Accordingly, in the description below, when the term "light-emitting diode" is used a concept of "element" is included in principle in the term. A conductive fixing member layer is made of ITO. A conductive fixing member precursor layer is made of a solution-type conductive material not containing fine particles having a particle diameter exceeding $1 \times 10^{-7}$ m. More specifically, this solution-type conductive material does not contain a filler. The solution-type conductive material is composed of a material in which a colloidal substance is dispersed in a solution, the colloidal substance being prepared by hydrolyzing an indium alkoxide or a tin alkoxide and then polymerizing the hydrolyzed product. In Example 1, wiring is made of gold (Au) and a connecting portion (second electrode) of the light-emitting diode is composed of metal multilayer films having a Ag/Pt/Au structure. In the connecting portion (second electrode) of the light-emitting diode composed of the metal multilayer films having the Ag/Pt/Au structure, the Ag film is in contact with a light-emitting layer, and the Au film is in contact with a conductive fixing member layer. The wiring is composed of a plurality of strip-shaped wirings. A base having the wiring thereon is composed of a glass substrate on which an insulating film made of $SiO_2$ is provided. An electronic device produced using the method of Example 1 is a light-emitting diode displayed unit. These structures are the same as those in Examples 2 to 5 described below.

Figure 1:
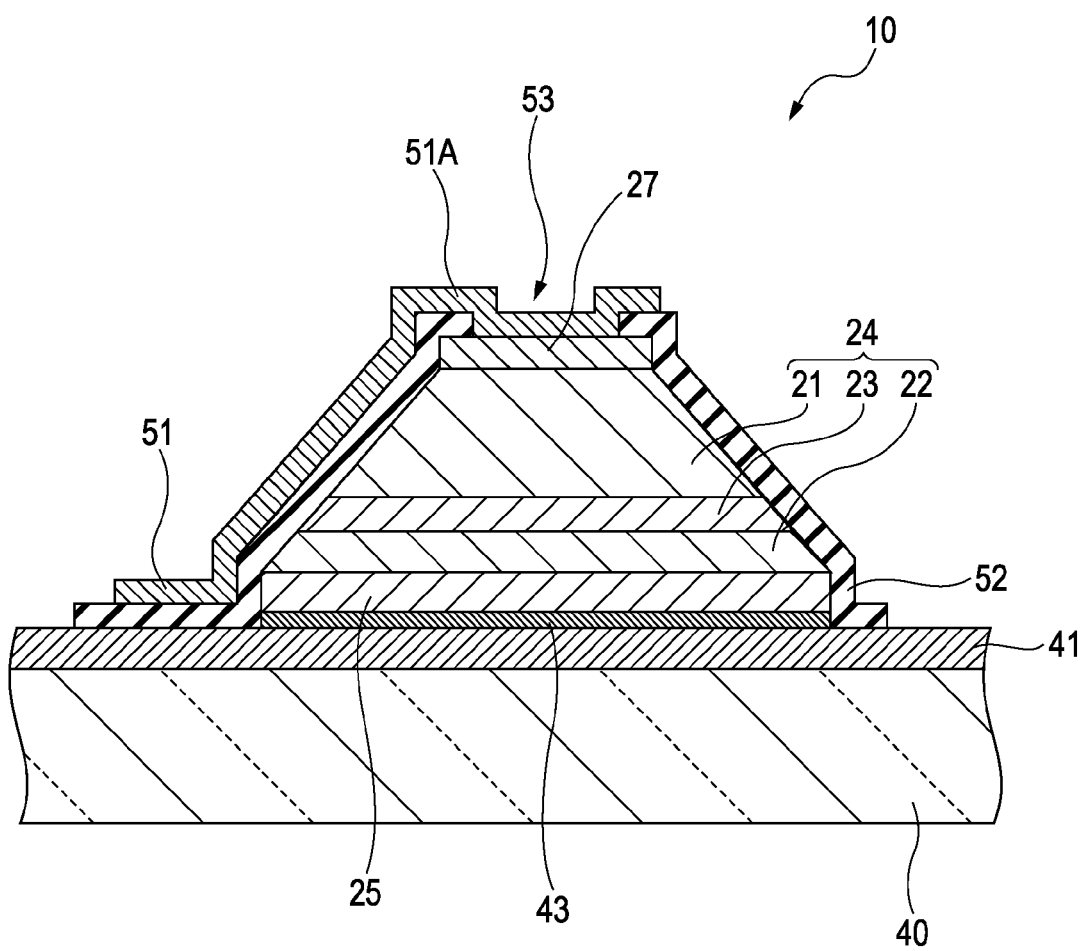
FIG. 1 is a schematic partial cross-sectional view of a light-emitting diode assembly including an element (light-emitting element) obtained by a method of electrically connecting an element to wiring or a method of producing a light-emitting element assembly of Example 1.

FIG. 1 is a schematic partial cross-sectional view of a light-emitting diode assembly produced by the method of Example 1. In this light-emitting diode assembly, a connecting portion (p-side electrode or second electrode) 25 of a light-emitting diode 10 and wiring 41 provided on a base 40 are fixed with a conductive fixing member layer 43 therebetween. The conductive fixing member layer 43 is disposed only under the light-emitting diode 10. The conductive fixing member layer 43 is made of ITO. More specifically, this light-emitting diode assembly is composed of the light-emitting diode 10, the base 40, the wiring 41 provided on the base 40, the conductive fixing member later 43, second wiring 51 and an insulating layer 52. The light-emitting diode 10 is composed of the connecting portion (p-side electrode or second electrode) 25, a light-emitting layer 24, and a first electrode (n-side electrode) 27. The light-emitting layer 24 has a laminated structure including, from the n-side electrode side, a first compound semiconductor later 21 of an n-conductivity type, an active layer 23, and a second compound semiconductor layer 22 of a p-conductivity type. The wiring 41 and the connecting portion (p-side electrode or second electrode) 25 are fixed (for example, bonded) to each other, with the conductive fixing member layer 43 therebetween. The conductive fixing member layer 43 is provided only under the light-emitting diode 10. More specifically, a portion of the conductive fixing member layer 43 located under the light-emitting diode 10 is left, but other portions of the conductive fixing member layer 43 have been removed. The side faces and the top face (n-side electrode 27) of the light-emitting diode 10 are covered with the insulating layer 52. An opening 53 is provided in the insulating layer 52 located on the n-side electrode 27. The second wiring 51 is provided on the insulating layer 52. Furthermore, an extending portion 51A of the second wiring is provided so as to extend from the n-side electrode 27 to the second wiring 51 via the opening 53. The wiring 41 extends in the direction parallel to the surface of the drawing, and the second wiring 51 extends in the direction perpendicular to the surface of the drawing. Light emitted from the light-emitting layer 24 is emitted from the base 40. The wiring 41 has a shape that does not interrupt the emitted light. A black matrix layer may be formed on areas of the base 40 where the emitted light does not pass through. Furthermore, by satisfactorily increasing the width of the extending portion 51A of the second wiring, a structure that imparts a light extraction function ma) be formed (for example, a structure that also functions as a light extraction mirror may be formed). The light-emitting diode 10 has a truncated conical shape as a whole. Each of the compound semiconductors constituting the first compound semiconductor layer 21, the active layer 23, and the second compound semiconductor later 22 is specifically composed of a GaInN compound semiconductor or an AlGaInP compound semiconductor. These structures are the same as those in Examples 2 to 5 described below.

When the light-emitting diode 10 is, for example, a GaN light-emitting diode, specific examples of the dimensions of the layers, the materials thereof and the like are as follows. The first compound semiconductor layer 21 is composed of an n-type GaN later having a thickness of 2.6 µm. The active layer 23 has a thickness of, for example, 0.2 µm and has a multiple quantum well (MQW) structure including InGaN well layers and GaN barrier layers. The second compound semiconductor layer 22 is composed of a p-type GaN layer having a thickness of 0.2 µm. When the GaN light-emitting diode is a blue-light-emitting diode, the indium (In) composition of the InGaN well layers in the active layer 23 is, for example, 0.17. When the GaN light-emitting diode is a green-light-emitting diode, the indium (In) composition of the InGaN well layers is, for example, 0.25. The maximum diameter of the light-emitting diode 10, that is, the diameter of the bottom surface of the second compound semiconductor layer 22 is 20 µm. The total thickness of the light-emitting diode 10 is 5 µm. As described above, the connecting portion (p-side electrode) 25 is composed of, for example, metal multilayer films having a Ag/Pt/Au structure. The n-side electrode 27 is composed of for example, metal multilayer films having a Ti/Pt/Au structure. These structures are the same as those in Examples 2 to 5 described below.

In Example 1, the volume resistivity of the conductive fixing member layer 43 is $3 \times 10^{-3}$ Ω·m (0.3 Ω·cm), and the thickness of the conductive fixing member layer 43 is about 30 nm.

The method of Example 1 will now be described with reference to FIG. 1; FIGS. 2A to 2H, which are schematic process views- and FIGS. 3A and 3B, FIGS. 4A to 4C, FIGS. 5A and 5B, FIGS. 6A and 6B, FIGS. 7A and 7B, and FIGS. 8A and 8B, all of which are schematic partial cross-sectional views of a laminated structure and other components.

[Step-100]

First, a light-emitting layer 24 composed of a laminated structure of compound semiconductor layers is formed on a substrate for element production 20 by a method in the related art, and a connecting portion (corresponding to a p-side electrode) 25 is then formed on the light-emitting layer 24. More specifically, for example, a first compound semiconductor layer 21 of an n-conductivity type, an active layer 23, and a second compound semiconductor layer 22 of a p-conductivity, type are sequentially formed on the substrate for element production 20 composed of a sapphire substrate having a nominal diameter of 2 inches by an MOCVD method. Furthermore, the connecting portion (p-side electrode or second electrode) 25 composed of a metal multilayer films having a Ag/Pt/Au structure is formed on the second compound semiconductor layer 22 by a vacuum deposition method. Thus, a laminated structure 26 composed of the light-emitting layer 24, which includes the first compound semiconductor layer 21, the active layer 23, and the second compound semiconductor layer 22, and the connecting portion (p-side electrode) 25 can be produced (refer to FIG. 2A and FIG. 3A). Note that, in some drawings, the light-emitting later 24 or the laminated structure 26 is shown as a single layer.

[Step-110]

Subsequently, the laminated structure 26 is bonded to a relay substrate 30 in such a manner that the connecting portion (p-side electrode) 25 contacts the relay substrate 30. The substrate for element production 20 is then removed from the light-emitting layer 24. An n-side electrode 27 is then formed on the exposed light-emitting later 24. Subsequently, the light-emitting layer 24 and other layers are patterned, thus separating the layers into light-emitting diodes 10. Specifically, first the connecting portion (p-side electrode) 25 is bonded to the relay substrate 30 (refer to FIG. 2B and FIG. 3B). More specifically, the relay substrate 30, which is a glass substrate having an adhesive layer 31 composed of an uncured adhesive agent thereon is prepared. The connecting portion (aside electrode) 25 of the laminated structure 26 is bonded to the adhesive layer 31, and the adhesive layer 31 is cured. Subsequently, the substrate for element production 20 is removed from the light-emitting layer 24 (refer to FIG. 2C and FIG. 4A). Specifically, the interface between the light-emitting layer 24 (more specifically, the first compound semiconductor layer 21) and the substrate for element production 20 is irradiated with an excimer laser via the substrate for element production 20. As a result, laser ablation occurs, thus detaching the substrate for element production 20 from the light-emitting layer 24.

Figure 4A:
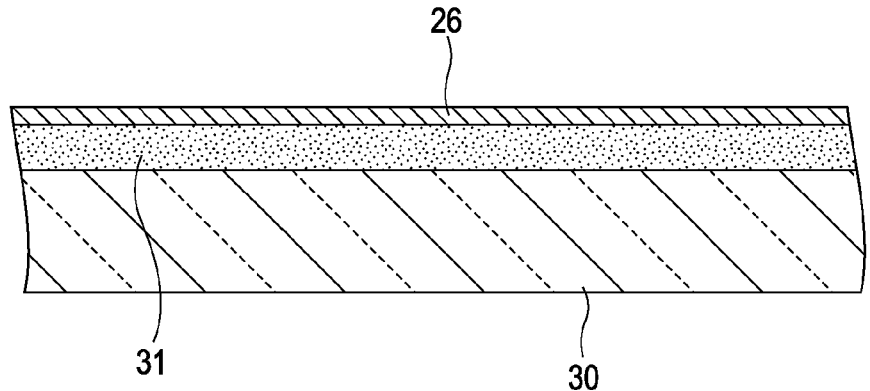
FIGS. 4A and 4B are schematic partial cross-sectional views of the light-emitting layer and other components after processing shown in FIG. 3B has been performed in the method of electrically connecting an element to wiring or the method of producing a light-emitting element assembly of Example 1.
Figure 4B:
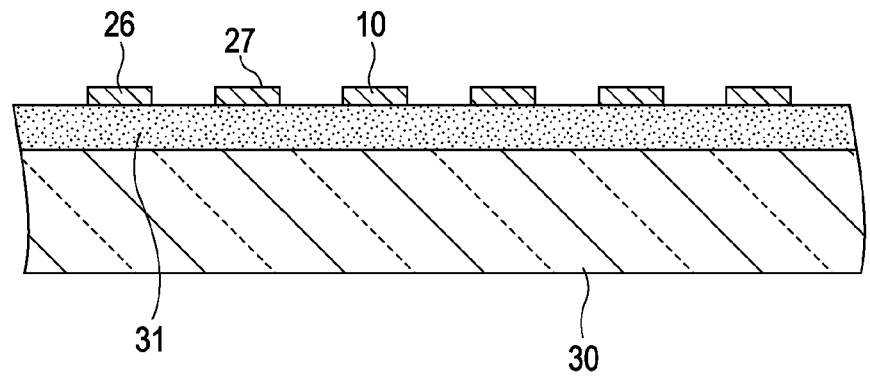
Figure 4C:
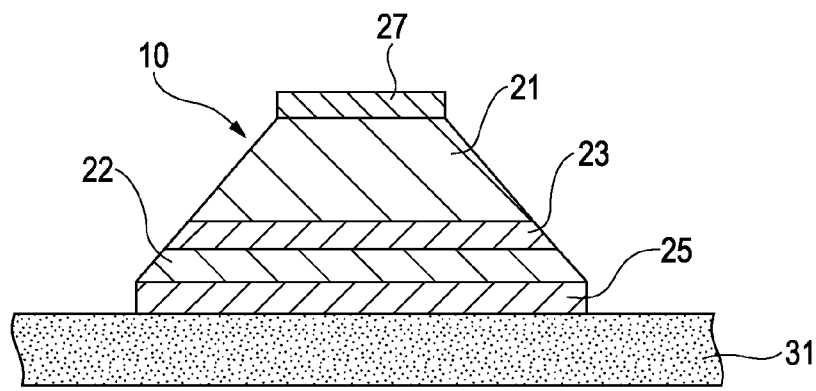
FIG. 4C is an enlarged schematic partial cross-sectional view of a light-emitting diode obtained in [Step-110]
Figure 5A:
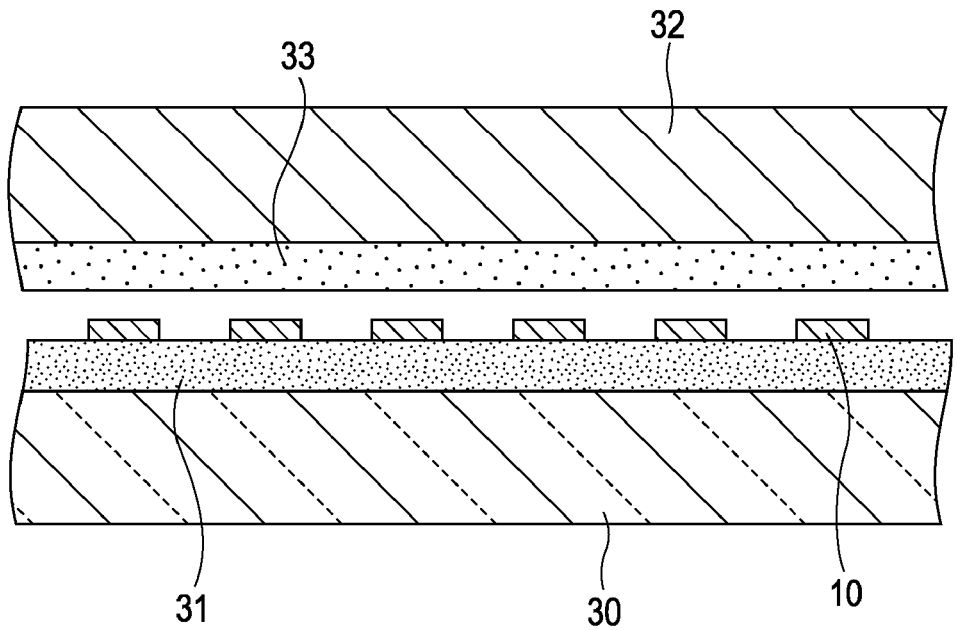
FIGS. 5A and 5B are schematic partial cross-sectional views of the light-emitting layer and other components after processing shown in FIG. 4B has been performed in the method of electrically connecting an element to wiring or the method of producing a light-emitting element assembly of the Example 1.
Figure 5B:
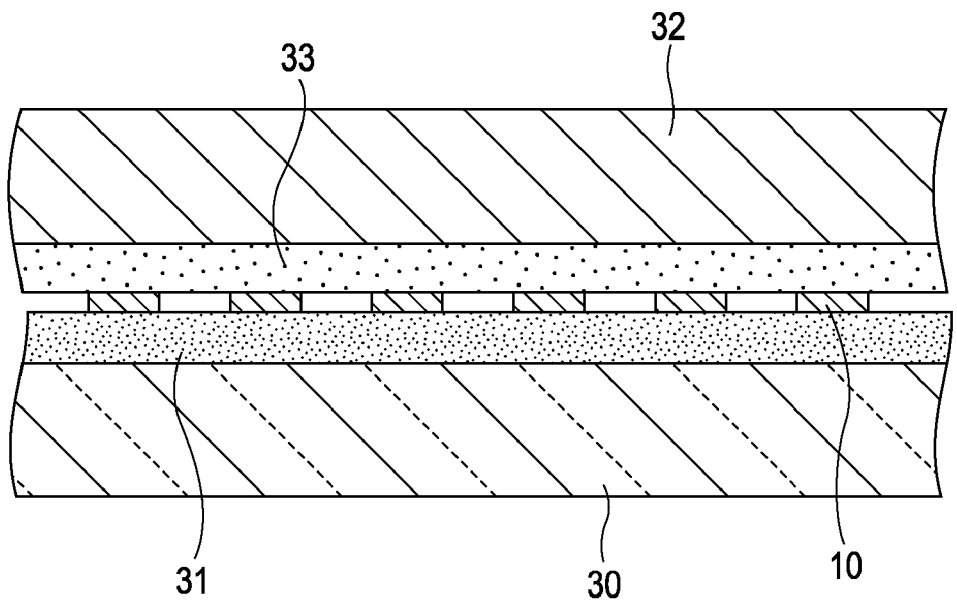
Figure 6A:
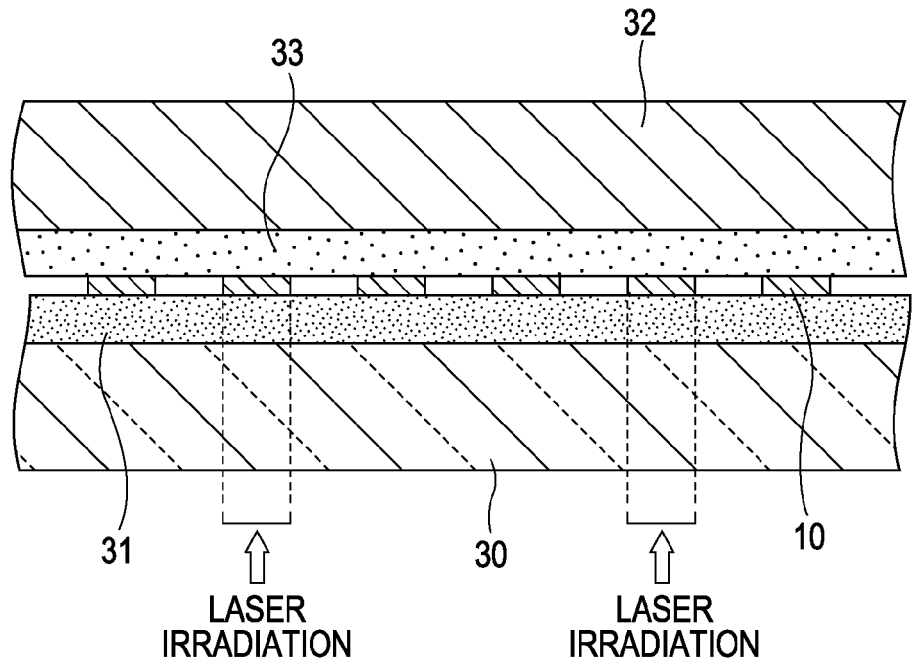
FIGS. 6A and 6B are schematic partial cross-sectional views of the light-emitting layers and other components after processing shown in FIG. 6B has been performed in the method of electrically connecting an element to wiring or the method of producing a light-emitting element assembly of Example 1.
Figure 6B:
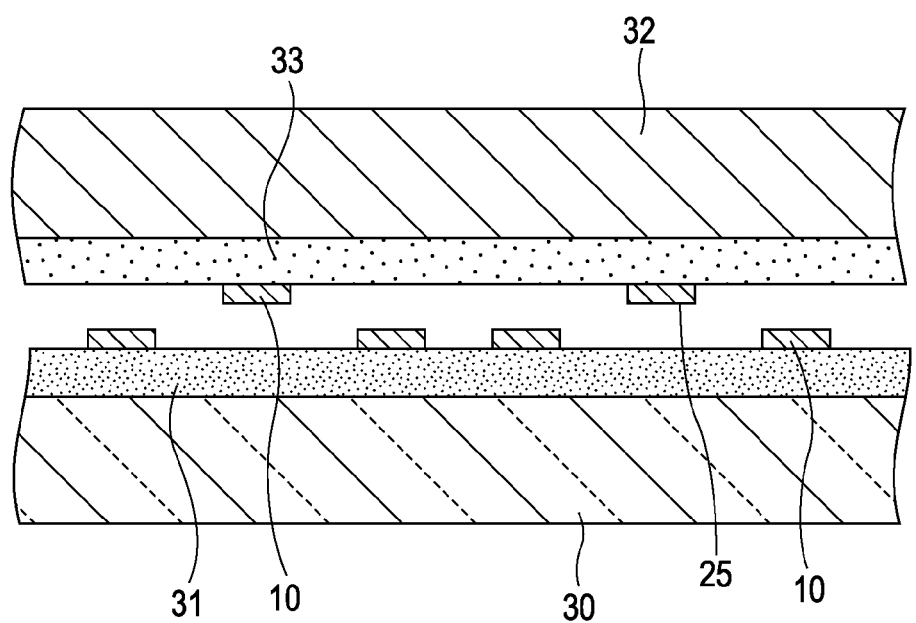
Figure 7A:
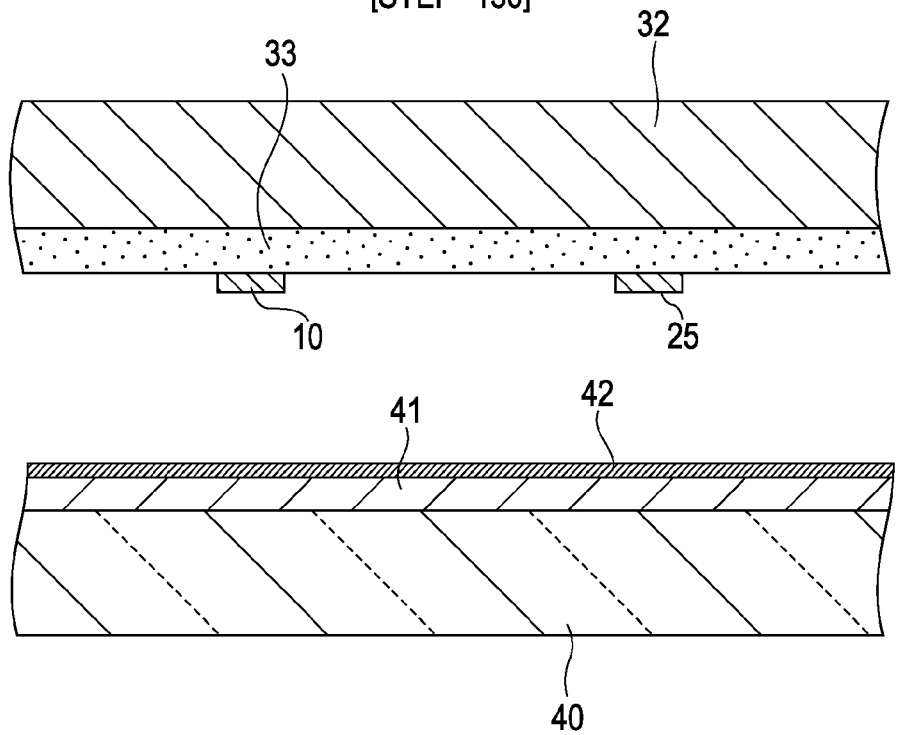
FIGS. 7A and 7B are schematic partial cross-sectional views of the light-emitting layer and other components after processing shown in FIG. 6B has been performed in the method of electrically connecting an element to wiring or the method of producing a light-emitting element assembly of Example 1.
Figure 7B:
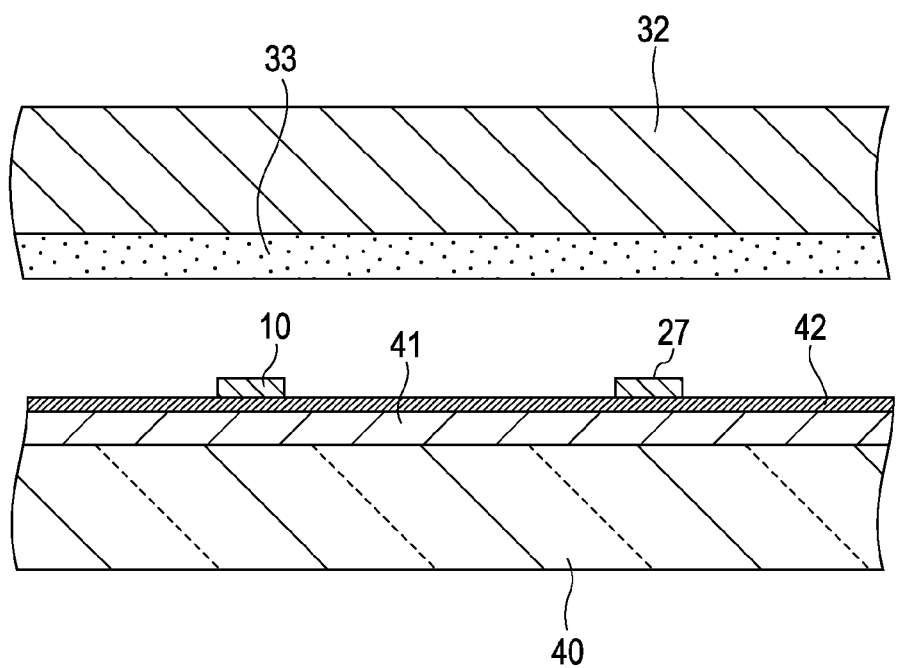

Subsequently, the first electrode (n-side electrode) 27 is formed on the first compound semiconductor layer 21 included in the light-emitting layer 24, which has been bonded to the relay substrate 30 (refer to FIG. 2D). The first electrode (n-side electrode) 27, the light-emitting layer 24, and the connecting portion (p-side electrode) 25 are then etched using a photolithography technique and an etching technique. Thus, a plurality of light-emitting diodes 10 can be produced (refer to FIG. 4B). FIG. 4C is an enlarged schematic partial cross-sectional view of one of the light-emitting diodes 10. The light-emitting diodes 10 are left on the relay substrate 30 in an array (a two-dimensional matrix shape). The planar shape of each of the light-emitting diodes 10 is a circular shape having a diameter of 20 µm.

[Step-120]

Subsequently, desired light-emitting diodes 10 are transferred from being disposed on the relay substrate 30 to being disposed on a substrate (for the sake of convenience, hereinafter referred to as "supporting substrate 32"). That is, each of the light-emitting diodes 10 bonded to the relay substrate 30 is adhered to the supporting substrate 32. Specifically, first, a slightly pressure-sensitive later 33 provided on a surface of the supporting substrate 32 composed of a glass plate is pressed onto the light-emitting diodes 10 which are left on the relay substrate 30 in an array (a two-dimensional matrix shape) (refer to FIG. 2E and FIGS. 5A and 5B). The slightly pressure-sensitive layer 33 is made of for example, a silicone rubber. The supporting substrate 32 is held in a positioning device (nor shown in the figure). The positional relationship between the supporting substrate 32 and the relay substrate 30 can be adjusted by operating the positioning device. Subsequently, for example an excimer laser is irradiated on the light-emitting diodes 10 to be mounted from the back surface side of the relay substrate 30 (refer to FIG. 6A). As a result, laser ablation occurs, and thus the light-emitting diodes 10 irradiated with the excimer laser are detached from the relay substrate 30. Subsequently, when the contact between the supporting substrate 32 and the light-emitting diodes 10 is released, the light-emitting diodes 10 detached from the relay substrate 30 are adhered to the slightly pressure-sensitive layer 33 (refer to FIG. 2F and FIG. 6B).

[Step-130]

Subsequently, the method according to the first embodiment is performed. That is, a conductive fixing member precursor layer 42 is formed at least on wiring 41 provided on a base 40. Specifically, the conductive fixing member precursor layer 42 is formed on the base 40 including the top surface of the wiring 41. More specifically, the wiring 41 is formed by a method in the related art on an insulating film (not shown) made of $SiO_2$ provided on the surface of a glass substrate, thus allowing the base 40 to be prepared. The conductive fixing member precursor layer 42 is then formed on the entire surface by a spin coating method (refer to FIG. 7A). The conductive fixing member precursor layer 42 may be pre-baked, for example, at 60° C. for one minute, if necessary.

Subsequently, the light-emitting diodes 10 each including the connecting portion (p-side electrode) 25 are disposed on the wiring 41 such that the connecting portion (p-side electrode) 25 is in contact with the conductive fixing member precursor layer 42 (refer to FIGS. 2G and 2H, and FIGS. 7A and 7B). Specifically, the light-emitting diodes 10 are removed from the supporting substrate 32 in a state in which the connecting portion (p-side electrode or second electrode) 25 provided on each of the light-emitting diodes 10 supported on the supporting substrate 32 is in contact with the conductive fixing member precursor layer 42. More specifically, the light-emitting diodes 10 adhered to the slightly pressure-sensitive layer 33, which are prepared in [Step-120], are pressed onto the conductive fixing member precursor layer 42. The light-emitting diodes 10 are merely relatively weakly adhered to the slightly pressure-sensitive layer 33, and the conductive fixing member precursor layer 42 has adhesiveness (i.e., tackiness). Therefore, the light-emitting diodes 10 pressed onto the conductive fixing member precursor latter 42 are detached from the slightly pressure-sensitive layer 33. When the supporting substrate 32 is moved in a direction in which the supporting substrate 32 is separated from the base 40 while the light-emitting diodes 10 are in contact with (pressed on) the conductive fixing member precursor layer 42, the light-emitting diodes 10 are left on the conductive fixing member precursor layer 42. Thus, a desired number of light-emitting diodes 10 can be temporarily fixed on the conductive fixing member precursor layer 42. Note that the conductive fixing member precursor layer 42 has adhesiveness (i.e., tackiness) to the extent that the light-emitting diodes 10 are not moved from the conductive fixing member precursor layer 42.

Above-described [Step-120] and [Step-130] are repeated a desired number of times, and thus, a desired number of light-emitting diodes are temporarily fixed on the wiring 41. For the sake of convenience, such a method using the supporting substrate 32 is referred to as "step transfer method". By repeating the step transfer method a desired number of times, a desired number of light-emitting diodes 10 are arranged on the conductive fixing member precursor layer 42 in a two-dimensional matrix shape. Specifically, a case where light-emitting diodes whose number is 1,920×1,080×(the number of three types of light-emitting diodes) are mounted is supposed. In one step transfer, for example, light-emitting diodes 10 whose number is 160×120 are arranged on the conductive fixing member precursor layer 42 in a two-dimensional matrix shape. In this case, by repeating the step transfer method (1,920×1,080)/(160×120)=108 times, 1,920×1,080 light-emitting diodes 10 can be arranged on the conductive fixing member precursor later 42. By repeating a set of [Step-100] to [Step-130] three times, a predetermined number of red-light-emitting diodes, a predetermined number of green-light-emitting diodes, and a predetermined number of blue-light-emitting diodes can be mounted on the base 40 at predetermined intervals and pitches. The light-emitting diodes 10 remaining on the relay substrate 30 can be used for mounting on the next base 40.

[Step-140]

Subsequently, the conductive fixing member precursor layer 42 is heated to form a conductive fixing member layer 43. Thereby, the connecting portion (p-side electrode) 25 of each of the light-emitting diodes 10 is fixed to the wiring 41, with the conductive fixing member layer 43 therebetween (refer to FIG. 8A). Specifically, for example, the temperature is increased to 350° C. in an oxygen gas atmosphere or in an air atmosphere, and heating (a baking treatment) is performed at 350° C. for 30 minutes. The atmosphere is then changed to a nitrogen gas atmosphere and the temperature is increased to 450° C., and heating (an annealing treatment) is performed at 450° C. for 30 minutes. The heating (annealing treatment) in the nitrogen atmosphere may be omitted. The conductive fixing member layer 43 made of ITO obtained under the above heating conditions is in an amorphous state.

[Step-150]

Figure 8A:
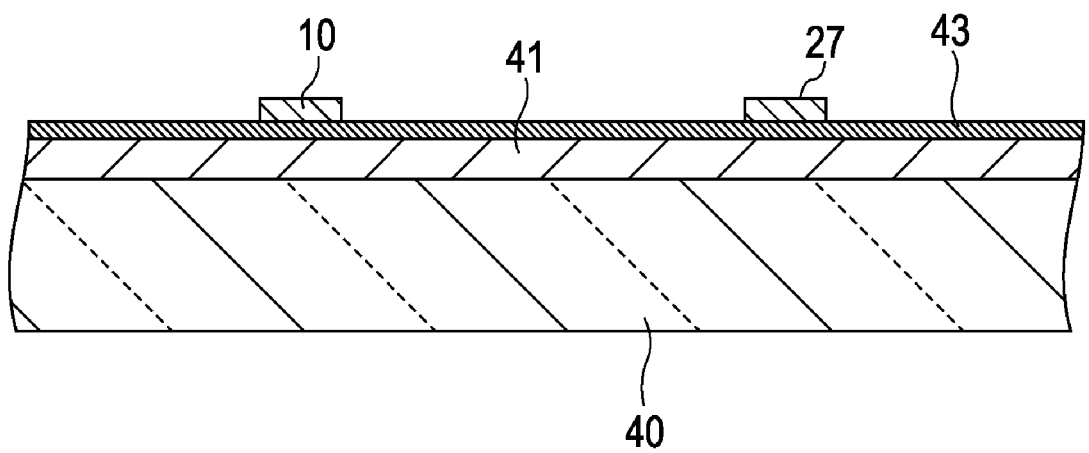
FIGS. 8A and 8B are schematic partial cross-sectional views of the light-emitting layer and other components after processing shown in FIG. 7B has been performed in the method of electrically connecting an element to wiring or the method of producing a light-emitting element assembly of Example 1.
Figure 8B:
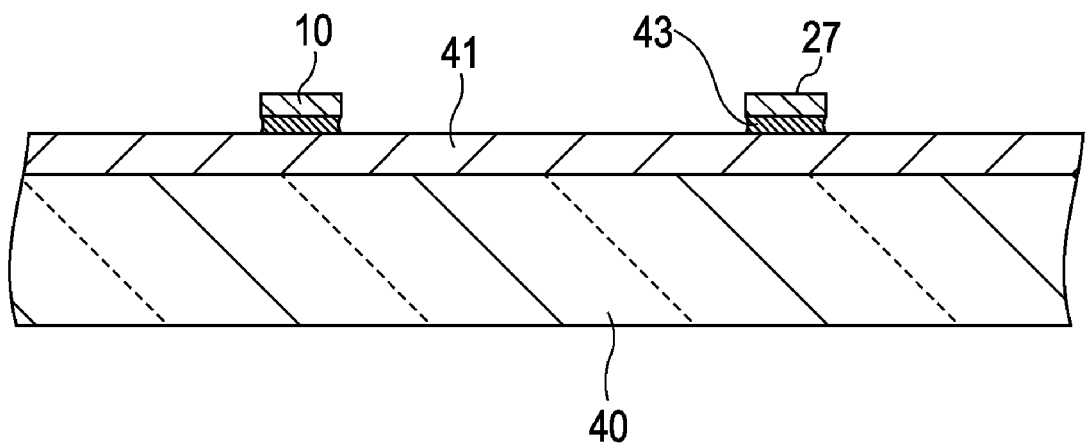

Next, portions of the conductive fixing member layer 43 located under the light-emitting diodes 10 are left and other portions of the conductive fixing member layer 43 are removed (refer to FIG. 8B). Specifically, the whole base 40 is immersed in an etchant composed of a ferric chloride aqueous solution or an organic acid. In this case, the light-emitting diodes 10 function as a mask for etching, and thus, the exposed portions of the conductive fixing member layer 43 that are not covered with the light-emitting diodes 10 can be removed. Accordingly, the light-emitting diodes 10 can be fixed on the wiring 41 with an electrical connection.

[Step-160]

Subsequently, an insulating layer 52 is formed so as to cover each of the light-emitting diodes 10, and an opening 53 is formed in the insulating latter 52 located on the first electrode (n-side electrode) 27 of each of the light-emitting diodes 10. Second wiring 51 connected to the first electrode (n-side electrode) 27 and an extending portion 51A of the second wiring are formed on the insulating layer 52 (refer to FIG. 1). The wiring 41 and the second wiring 51 are connected to a driving circuit. Thus, a light-emitting diode display unit can be produced.

In Example 1, the connecting portion provided on a light-emitting diode can be reliably and relatively easily connected to the wiring with high reliability. In addition, when a very) small light-emitting diode is mounted on a base, a phenomenon in which the light-emitting diode is shifted to an undesired position or inclined can be prevented. Accordingly, the light-emitting diode can be easily and reliably mounted with a high positional accuracy.

Example 2

Example 2 is a modification of Example 1. In Example 2, a metal constituting wiring 41 and a metal constituting a connecting portion (p-side electrode or second electrode) 25 of a light-emitting diode 10 are silver (Ag). In Example 2, after [Step-150] is performed, a heat treatment for alloying is performed so that silver (Ag) which is a metal constituting the wiring 41, metals (indium and tin) constituting the conductive fixing member layer 43, and silver (Ag) which is a metal constituting the connecting portion (p-side electrode) 25 of the light-emitting diode 10 are alloyed. The heat treatment for alloying was performed in a nitrogen gas atmosphere at a temperature of 350° C. for 30 minutes. The method of Example 2 can be performed as in Example 1 except for this point. Therefore, a detailed description of the method of Example 2 is omitted.

Example 3

Figure 9A:
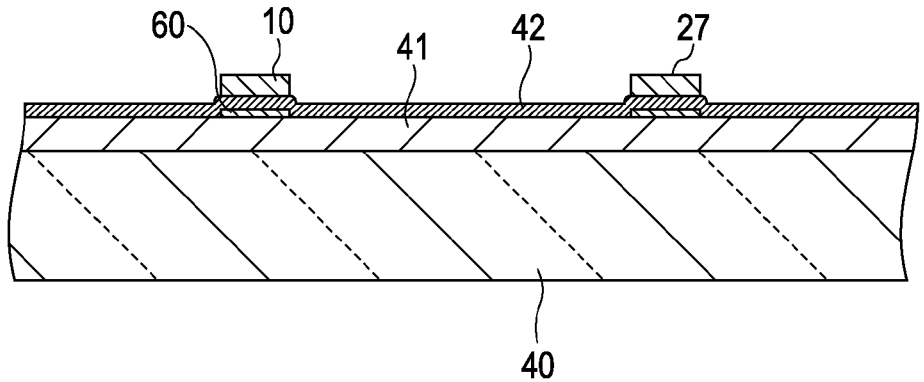
FIGS. 9A and 9B are schematic partial cross-sectional views of Example 3 in the same step as [Step-140] of Example 1.
Figure 9B:
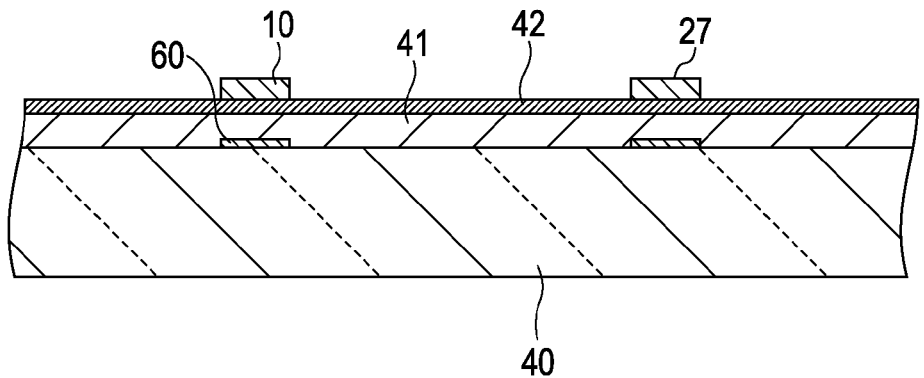

Example 3 is also a modification of Example 1. In Example 3, a metal layer 60 for alloying is provided in an area of a projection image of a light-emitting diode 10 that is vertically projected on a base 40. Specifically, as shown in FIG. 9A, which is a schematic partial cross-sectional view in the same step as [Step-140] of Example 1, the metal layer 60 made of titanium (Ti) is provided on the wiring 41. Alternatively, as shown in FIG. 9B, the metal layer 60 made of Ti may be provided between the wiring 41 and the base 40.

Figure 9C:
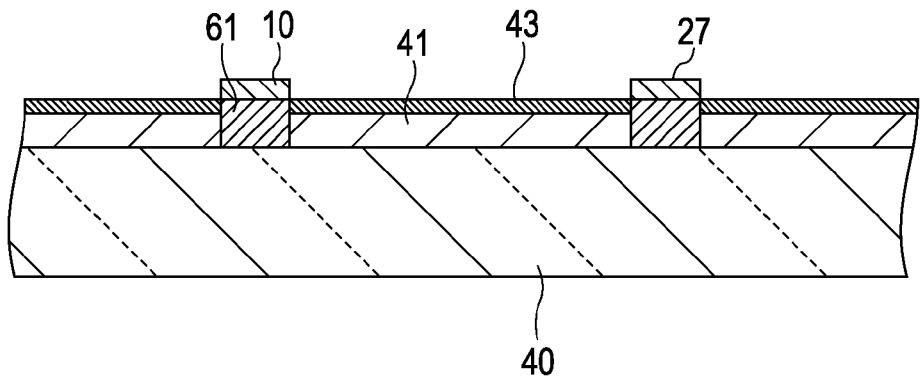
FIG. 9C is a schematic partial cross-sectional view of a light-emitting diode and other components after a heat treatment for alloying has been performed.

In Example 3, in the same step as [Step-140], the temperature was increased to 350° C. in an air atmosphere, and heating (a baking treatment) was performed at 350° C. for 60 minutes. A heat treatment for alloying was also performed at the same time during this heating. Specifically, gold (Au) which is a metal constituting the wiring 41, metals (indium and tin) constituting the conductive fixing member layer 43, gold (Au) which is a metal constituting the connecting portion (p-side electrode) 25 of the light-emitting diode 10, and the metal layer 60 made of titanium (Ti) were alloyed. As a result, as shown in FIG. 9C, an alloy layer 61 was formed from a portion of the conductive fixing member precursor layer 42 located under the light-emitting diode 10, the metal layer 60, and a portion of the wiring 41; or an alloy layer 61 was formed from a portion of the conductive fixing member precursor layer 42 located under the light-emitting diode 10, a portion of the wiring 41, and the metal layer 60. The method of Example 3 can be performed as in Example 1 except for this point. Therefore, a detailed description of the method of Example 3 is omitted.

In Example 3, in the same step as [Step-150] of Example 1, portions of the conductive fixing member layer 43 located under the light-emitting diodes 10 are left and other portions of the conductive fixing member layer 43 are removed. Here, the portions of the conductive fixing member layer 43 located under the light-emitting diodes 10 have been alloyed, whereas other portions of the conductive fixing member layer 43 have not been alloyed. Accordingly, the etching rate of the alloyed portions of the conductive fixing member layer 43 located under the light-emitting diodes 10 is significantly different from the etching rate of the other portions of the conductive fixing member layer 43 which have not been alloyed. Consequently, the other portions of the conductive fixing member layer 43 which have not been alloyed can be reliably removed by etching. In addition, the formation of a mask for etching used for a photolithography technique and the like is not necessary.

Example 4

Example 4 relates to a light-emitting element assembled according to the second embodiment. In a light-emitting element assembly of Example 4, a connecting portion (p-side electrode or second electrode) 25 of a light-emitting diode 10 and wiring 41 provided on a base 40 are fixed with a conductive fixing member layer 43 therebetween, and the conductive fixing member layer 43 contains at least a metal atom, a carbon (C) atom, and an oxygen (O) atom. More specifically in Example 4, the conductive fixing member layer 43 contains indium (In) and tin (Sn) atoms, which are metal atoms, a carbon (C) atom, and an oxygen (O) atom. Here, the content of carbon (C) atom is about 20 weight percent.

In Example 4, in the same step as [Step-140] of Example 1, for example, the temperature was increased to 320° C. in an air atmosphere, and heating was performed at 320° C. for 30 minutes. In such a heating state at a relatively low temperature, a solvent and various organic substances (e.g., a stabilizing agent) contained in a conductive fixing member precursor layer 42 are removed. However, in this state, it is believed that a conductive fixing member layer 43 containing indium (In) and tin (Sn) atoms, which are metal atoms, a carbon (C) atom, and an oxygen (O) atom bonded to these atoms is formed, rather than a conductive fixing member layer 43 made of ITO is formed as a result of pyrolysis and chemical reaction of the conductive fixing member precursor layer 42. In this case, the conductive fixing member layer 43 had a volume resistivity of $3 \times 10^{-3}$ Ω·m (0.3 Ω·cm) and a thickness of about 30 nm.

The method of Example 4 can be performed as in Example 1 except for the above point. Therefore, a detailed description of the method of Example 4 is omitted.

Example 5

Example 5 relates to the method of electrically connecting an element to wiring according to the second embodiment and the method of producing a light-emitting element assembly according to the second embodiment. Hereinafter, these methods are generically referred to as "method of Example 5". A schematic partial cross-sectional view of a light-emitting diode assembly produced using the method of Example 5 is the same as FIG. 1. That is, in this light-emitting diode assembly, a connecting portion (p-side electrode or second electrode) 25 of a light-emitting diode 10 and wiring 41 provided on a base 40 are fixed with a conductive fixing member layer 43 therebetween. The conductive fixing member layer 43 is made of ITO. The conductive fixing member layer 43 is provided only under the light-emitting diode 10.

The method of Example 5 will now be described with reference to FIG. 1; FIGS. 2A to 2H, which are schematic process views; and FIGS. 3A and 3B, FIGS. 4A to 4C, FIGS. 5A and 5B, FIGS. 6A and 6B, FIGS. 10A and 10B, and FIG. 11, all of which are schematic partial cross-sectional views of a laminated structure and other components.

[Step-500]

Figure 3A:
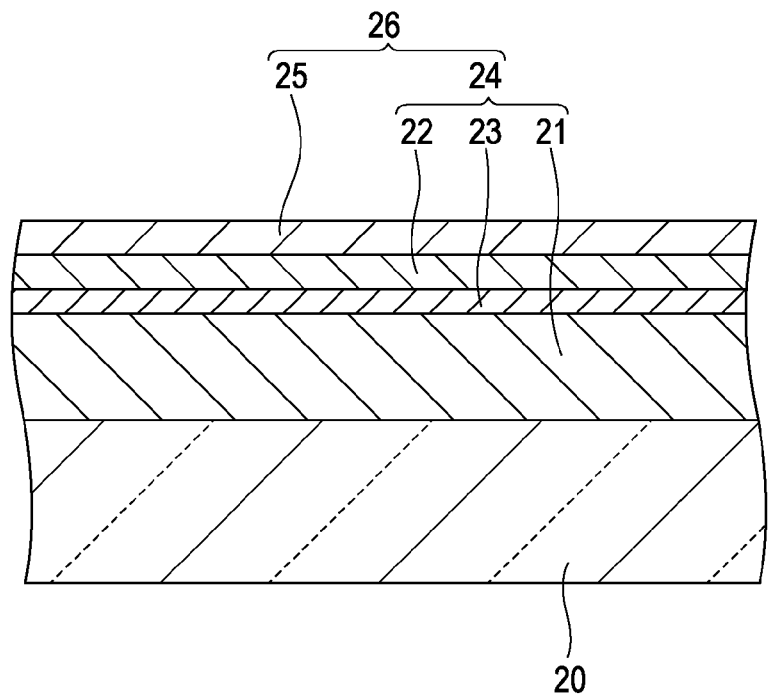
FIGS. 3A and 3B are schematic partial cross-sectional views of a light-emitting layer and other components illustrating the method of electrically connecting an element to wiring or the method of producing a light-emitting element assembly of Example 1.
Figure 3B:
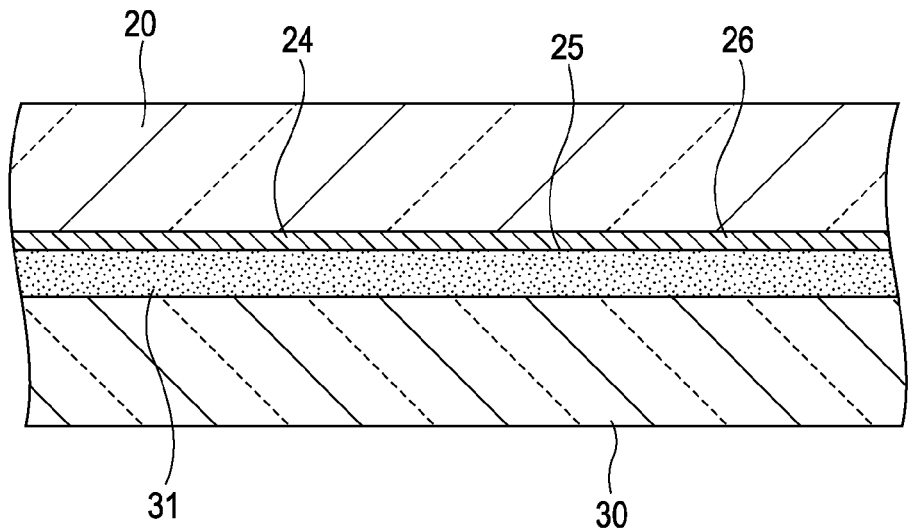

First, as in [Step-100] of Example 1, a light-emitting layer 24 composed of a laminated structure of compound semiconductor layers is formed on a substrate for element production 20 by a method in the related art, and a connecting portion (corresponding to a p-side electrode) 25 is then formed on the light-emitting layer 24 (refer to FIG. 2A and FIG. 3A).

[Step-510]

Subsequently, as in [Step-110] of Example 1, a laminated structure 26 is bonded to a relay substrate 30 in such a manner that the connecting portion (p-side electrode) 25 contacts the relay substrate 30. The substrate for element production 20 is then removed from the light-emitting layer 24. An n-side electrode 27 is then formed on the exposed light-emitting layer 24. Subsequently, the light-emitting layer 24 and other layers are patterned, thus separating the layers into light-emitting diodes 10 (refer to FIG. 2B to 2D, FIG. 3B, and FIGS. 4A to 4C).

[Step-520]

Subsequently, as in [Step-120] of Example 1, desired light-emitting diodes 10 are transferred from being disposed on the relay substrate 30 to being disposed on a supporting substrate 32 (refer to FIGS. 2E and 2F, FIGS. 5A and 5B, and FIGS. 6A and 6B).

[Step-530]

Subsequently, the method according to the second embodiment is performed. Specifically, a conductive fixing member precursor layer 42 is formed on the connecting portion (p-side electrode or second electrode) 25 provided on each of the light-emitting diodes 10 by an appropriate printing method (e.g., an ink-jet printing method) (refer to FIG. 10A). The conductive fixing member precursor layer 42 may be pre-baked, for example, at 60° C. for one minute, if necessary.

[Step-540]

Figure 10A:
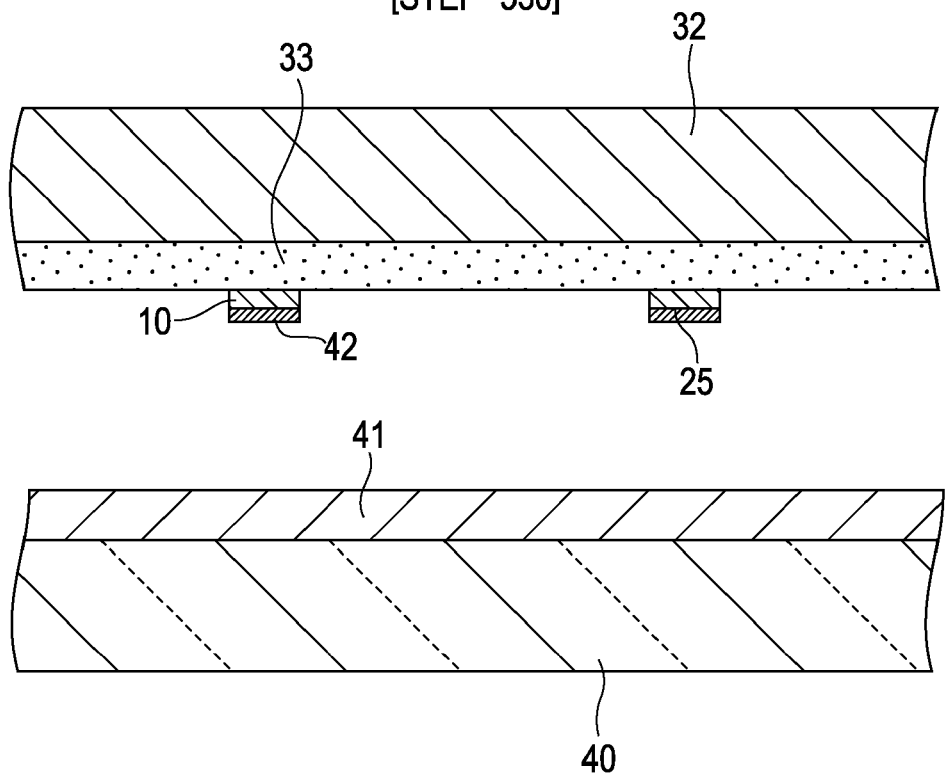
FIGS. 10A and 10B are schematic partial cross-sectional views of the light-emitting layer and other components after processing shown in FIG. 6B has been performed in a method of electrically connecting an element to wiring or a method of producing a light-emitting element assembly of Example 5.
Figure 10B:
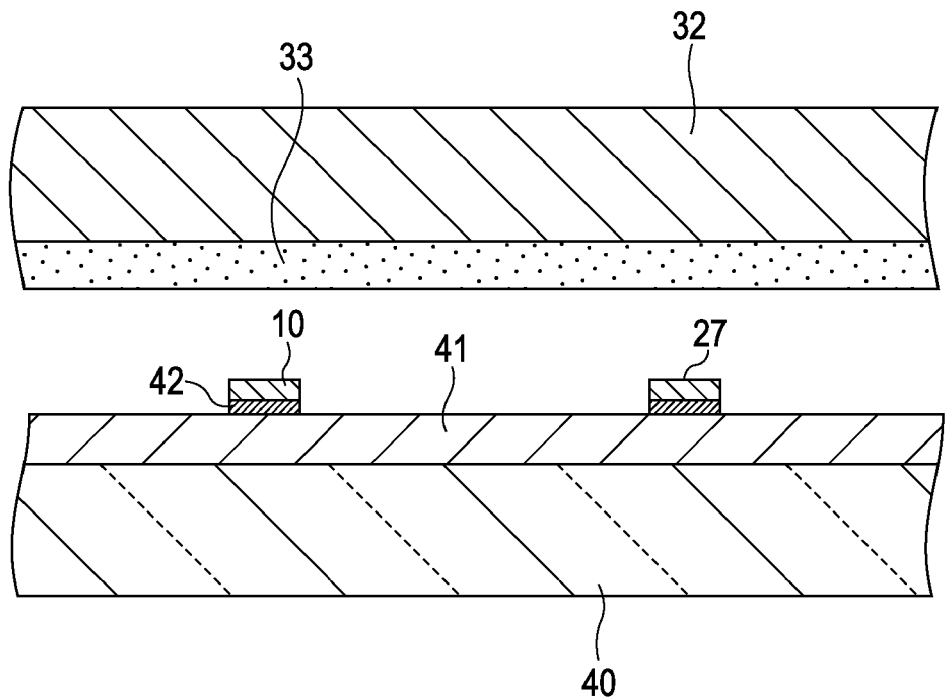
Figure 11:
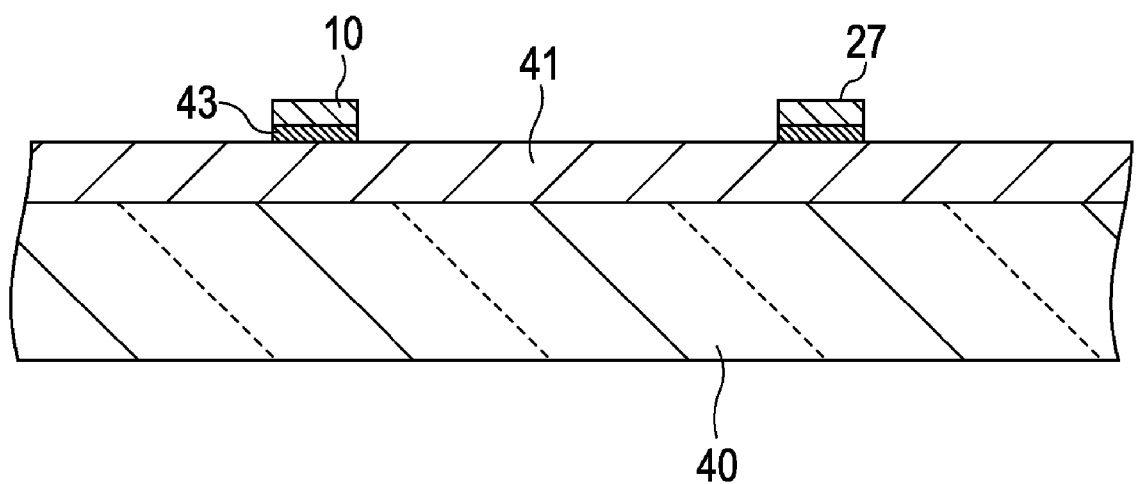
FIG. 11 is a schematic partial cross-sectional view of the light-emitting latter and other components after processing shout in FIG. 10B has been performed in the method of electrically connecting an element to wiring or the method of producing a light-emitting element assembly of Example 5.

Subsequently, the light-emitting diodes 10 are disposed on wiring 41 such that the conductive fixing member precursor layer 42 is in contact with the wiring 41 provided on a base 40 (refer to FIGS. 2G and 2H, and FIG. 10B). Specifically, the light-emitting diodes 10 are removed from the supporting substrate 32 in a state in which the conductive fixing member precursor layer 42 formed on the connecting portion (p-side electrode or second electrode) 25 provided on each of the light-emitting diodes 10 supported on the supporting substrate 32 is in contact with the wiring 41. More specifically, the conductive fixing member precursor layer 42 disposed on each of the light-emitting diodes 10 adhered to a slightly pressure-sensitive layer 33, which is prepared in [Step-530], is pressed onto the wiring 41. The light-emitting diodes 10 are merely relatively weakly adhered to the slightly pressure-sensitive layer 33, and the conductive fixing member precursor layer 42 has adhesiveness (i.e., tackiness). Therefore, the light-emitting diodes 10 in which the conductive fixing member precursor layer 42 is pressed on the wiring 41 are detached from the slightly pressure-sensitive layer 33. When the supporting substrate 32 is moved in a direction in which the supporting substrate 32 is separated from the base 40 while the conductive fixing member precursor layer 42 disposed on each of the light-emitting diodes 10 is in contact with (pressed on) the wiring 41, the light-emitting diodes 10 are left on the wiring 41 with the conductive fixing member precursor layer 42 therebetween. Thus, a desired number of light-emitting diodes 10 can be temporarily fixed on the wiring 41, with the conductive fixing member precursor layer 42 therebetween. Note that the conductive fixing member precursor layer 42 has adhesiveness (i.e., tackiness) to the extent that the conductive fixing member precursor layer 42 is not moved from the wiring 41.

Above-described [Step-530] and [Step-540] are repeated a desired number of times, and thus, a desired number of light-emitting diodes are temporarily fixed on the wiring 41. By repeating the step transfer method a desired number of times, a desired number of light-emitting diodes 10 are arranged on the wiring 41 with the conductive fixing member precursor layer 42 therebetween in a two-dimensional matrix shape. Furthermore, by repeating a set of [Step-500] to [Step-540] three times, a predetermined number of red-light-emitting diodes, a predetermined number of green-light-emitting diodes, and a predetermined number of blue-light-emitting diodes can be mounted on the base 40 at predetermined intervals and pitches. The light-emitting diodes 10 remaining on the relayed substrate 30 can be used for mounting on the next base 40.

[Step-550]

Subsequently, the conductive fixing member precursor layer 42 is heated to form a conductive fixing member layer 43. Thereby, the connecting portion (p-side electrode) 25 of each of the light-emitting diodes 10 is fixed to the wiring 41, with the conductive fixing member layer 43 therebetween (refer to FIG. 11). Specifically, for example, the temperature is increased to 350° C. in an oxygen gas atmosphere or in an air atmosphere, and heating (a baking treatment) is performed at 350° C. for 30 minutes. The atmosphere is then changed to a nitrogen gas atmosphere and the temperature is increased to 450° C., and heating (an annealing treatment) is performed at 450° C. for 30 minutes. The heating (annealing treatment) in the nitrogen atmosphere may be omitted. The conductive fixing member layer 43 made of ITO obtained under the above heating conditions is in an amorphous state.

[Step-560]

Subsequently, an insulating layer 52 is formed so as to cover each of the light-emitting diodes 10, and an opening 53 is formed in the insulating layer 52 located on the first electrode (n-side electrode) 27 of each of the light-emitting diodes 10. Second wiring 51 connected to the first electrode (n-side electrode) 27 and an extending portion 51A of the second wiring are formed on the insulating layer 52 (refer to FIG. 1). The wiring 41 and the second wiring 51 are connected to a driving circuit. Thus, a light-emitting diode display unit can be produced.

In Example 5, the connecting portion provided on a light-emitting diode can be reliably and relatively easily connected to the wiring with high reliability. In addition, when a very small light-emitting diode is mounted on a base, a phenomenon in which the light-emitting diode is shifted to an undesired position or inclined can be prevented. Accordingly, the light-emitting diode can be easily and reliably mounted with a high positional accuracy.

Figure 12A:
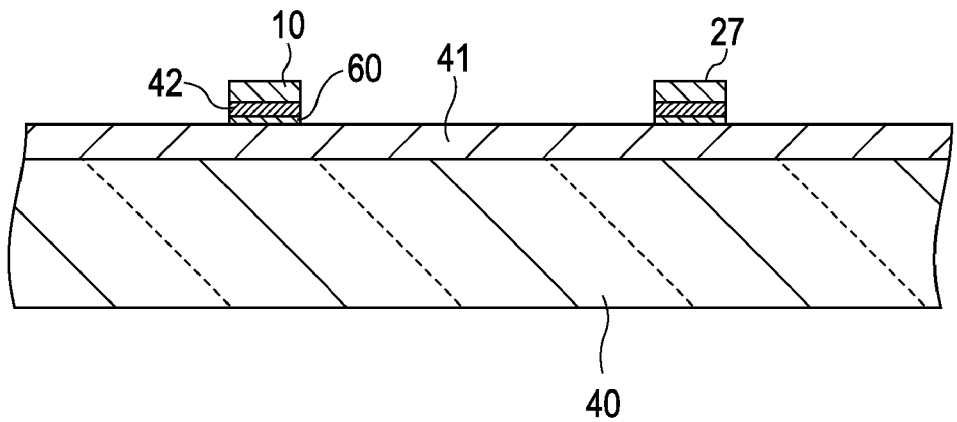
FIGS. 12A and 12B are schematic partial cross-sectional views of a modification of Example 5 as in Example 3 in the same step as [Step-540] of Example 5.
Figure 12B:
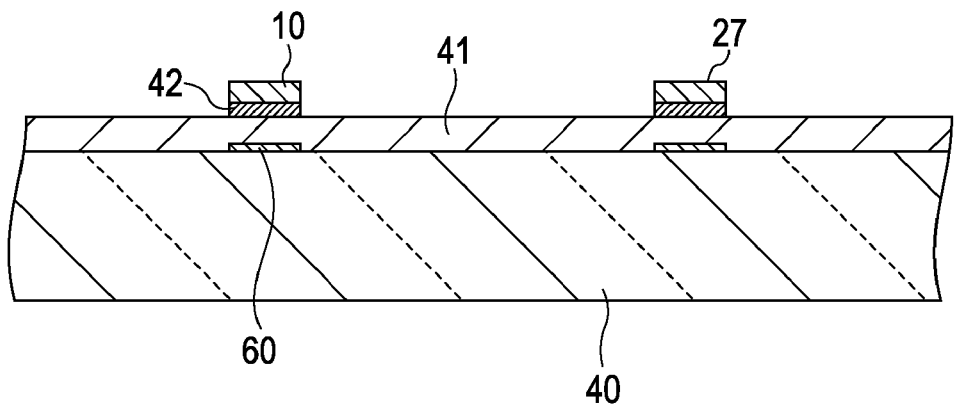
Figure 12C:
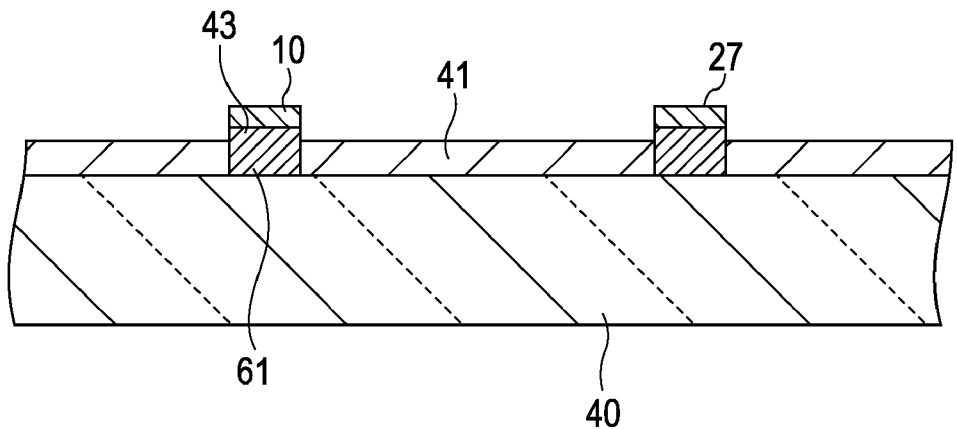
FIG. 12C is a schematic partial cross-sectional view of a light-emitting diode and other components after a heat treatment for alloying has been performed.
Figure 13A:
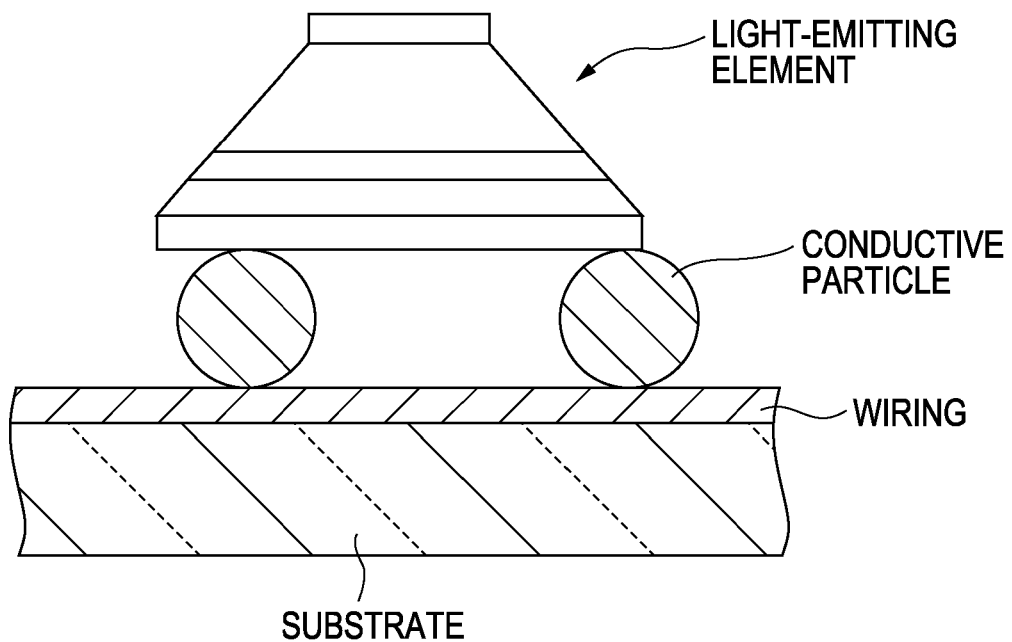
FIGS. 13A and 13B are schematic cross-sectional views each illustrating a problem in the related art.
Figure 13B:
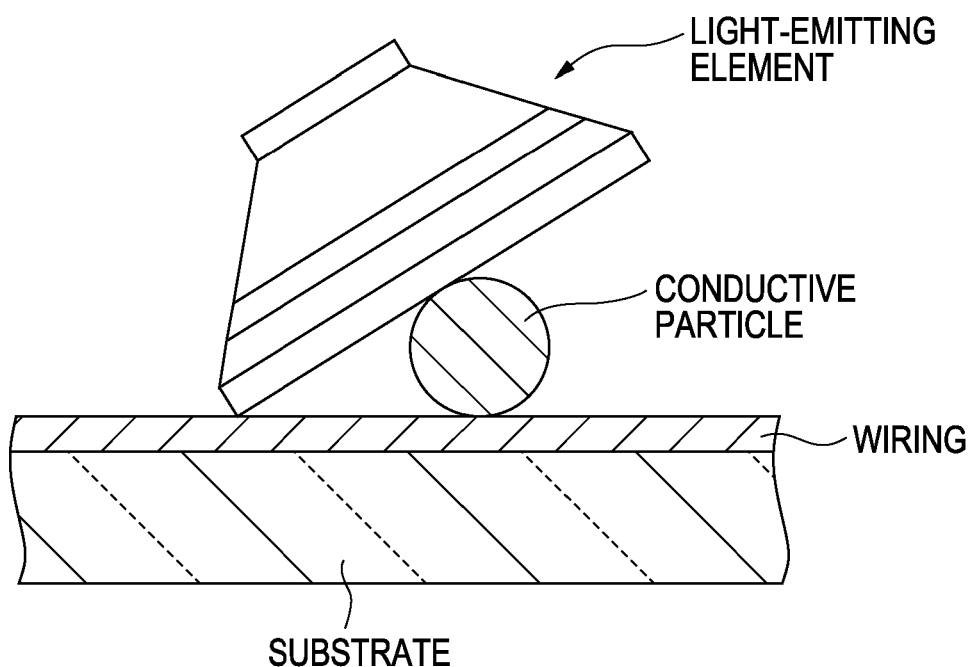

The alloying described in Example 2 can be applied to Example 5. The alloying described in Example 3 can also be applied to Example 5. FIG. 12A is a schematic partial cross-sectional view in the same step as [Step-540] of Example 5. A metal layer 60 made of Ti is provided on the wiring 41. Alternatively, as shown in FIG. 12B, the metal layer 60 made of Ti may be provided between the wiring 41 and the base 40. After [Step-540] is performed, a heat treatment for alloying is performed. Accordingly, gold (Au) which is a metal constituting the wiring 41, metals (indium and tin) constituting the conductive fixing member layer 43, gold (Au) which is a metal constituting the connecting portion (p-side electrode) 25 of the light-emitting diode 10, and the metal layer 60 made of titanium (Ti) are alloyed. As a result, as shown in FIG. 12C, an alloy layer 61 is formed from a portion of the conductive fixing member precursor layer 42 located under the light-emitting diode 10, the metal layer 60, and a portion of the wiring 41; or an alloy later 61 is formed from a portion of the conductive fixing member precursor layer 42 located under the light-emitting diode 10, a portion of the wiring 41, and the metal layer 60. The light-emitting element assembly according to the second embodiment described in Example 4 can also be applied to Example 5.

The present application has been described using preferred Examples. However, the present application is not limited to these Examples, and various modifications can be made on the basis of the technical idea. For example, numerical values, materials, configurations, structures, shapes, substrates, raw materials, and processes described in Examples are given as examples only. According to need, numerical values, materials, configurations, structures, shapes, substrates, raw materials, processes, and the like that are different from those used in Examples can be used.

In Examples 1 to 4, the conductive fixing member precursor layer 42 was formed on the entire surface (on the base 40 including the top surface of the wiring 41) by a spin coating method. Alternatively, the conductive fixing member precursor layer 42 may be formed only on desired areas of the wiring 41 by a printing method such as an ink-jet printing method, an offset printing method, a gravure printing method, a contact printing method, or an imprint method. According to such a method, [Step-150] of Example 1 can be omitted. Furthermore, in Examples, the number of connecting portions fixed on the wiring was one. However, the number of connecting portions is not limited thereto, and may be two or more in some elements or the like.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of electrically connecting an element to wiring comprising:
    (A) forming a conductive fixing member precursor layer at least on wiring provided on a base; and
    (B) arranging an element having a connecting portion on the wiring such that the connecting portion contacts the conductive fixing member precursor layer, and then heating the conductive fixing member precursor layer to form a conductive fixing member layer, thereby fixing the connecting portion of the element to the wiring, with the conductive fixing member layer therebetween,
    wherein the conductive fixing member precursor layer is composed of a solution-type conductive material.

2. The method of electrically connecting an element to wiring according to claim 1, wherein the conductive fixing member precursor layer is formed on the base including the top surface of the wiring in step (A), the method further including a step of:
    leaving a portion of the conductive fixing member layer located under the element by removing other portions of the conductive fixing member layer, the step being performed after step (B).

3. The method of electrically connecting an element to wiring according to claim 1, wherein, in step (B), the element is arranged on the wiring by removing the element from a substrate in a state in which the connecting portion provided on the element supported on the substrate is in contact with the conductive fixing member precursor layer.

4. The method of electrically connecting an element to wiring according to claim 1, wherein the conductive fixing member precursor layer does not contain fine particles having a particle diameter exceeding $1 \times 10^{-7}$ m.

5. The method of electrically connecting an element to wiring according to claim 1, wherein the conductive fixing member layer is made of indium tin oxide or indium zinc oxide.

6. The method of electrically connecting an element to wiring according to claim 1, wherein, by performing a heat treatment during step (B) or after step (B),
    a metal constituting the wiring and a metal constituting the conductive fixing member layer are alloyed,
    a metal constituting the connecting portion of the element and a metal constituting the conductive fixing member layer are alloyed, or
    a metal constituting the wiring and a metal constituting the conductive fixing member layer are alloyed and a metal constituting the connecting portion of the element and a metal constituting the conductive fixing member layer are alloyed.

7. The method of electrically connecting an element to wiring according to claim 6, wherein a metal layer for alloying is formed in an area of a projection image of the element that is vertically projected on the base.

8. A method of electrically connecting an element to wiring comprising:
    (A) forming a conductive fixing member precursor layer on a connecting portion provided on an element; and
    (B) arranging the element on wiring provided on a base such that the conductive fixing member precursor layer contacts the wiring, and then heating the conductive fixing member precursor layer to form a conductive fixing member layer, thereby fixing the connecting portion of the element to the wiring, with the conductive fixing member layer therebetween,
    wherein the conductive fixing member precursor layer is composed of a solution-type conductive material.

9. The method of electrically connecting an element to wiring according to claim 8, wherein, in step (B), the element is arranged on the wiring by removing the element from a substrate in a state in which the conductive fixing member precursor layer formed on the connecting portion provided on the element supported on the substrate is in contact with the wiring provided on the base.

10. The method of electrically connecting an element to wiring according to claim 8, wherein the conductive fixing member precursor layer does not contain fine particles having a particle diameter exceeding $1 \times 10^{-7}$ m.

11. The method of electrically connecting an element to wiring according to claim 8, wherein the conductive fixing member layer is made of ITO or IZO.

12. The method of electrically connecting an element to wiring according to claim 8, wherein, by performing a heat treatment during step (B) or after step (B),
    a metal constituting the wiring and a metal constituting the conductive fixing member layer are alloyed,
    a metal constituting the connecting portion of the element and a metal constituting the conductive fixing member layer are alloyed, or
    a metal constituting the wiring and a metal constituting the conductive fixing member layer are alloyed and a metal constituting the connecting portion of the element and a metal constituting the conductive fixing member layer are alloyed.

13. The method of electrically connecting an element to wiring according to claim 12, wherein a metal layer for alloying is formed in an area of a projection image of the element that is vertically projected on the base.

14. A method of producing a light-emitting element assembly comprising:
    (A) forming a conductive fixing member precursor layer at least on wiring provided on a base; and
    (B) arranging a light-emitting element having a connecting portion on the wiring such that the connecting portion contacts the conductive fixing member precursor layer, and then heating the conductive fixing member precursor layer to form a conductive fixing member layer, thereby fixing the connecting portion of the light-emitting element to the wiring, with the conductive fixing member layer therebetween, wherein the conductive fixing member precursor layer is composed of a solution-type conductive material.

15. The method of producing a light-emitting element assembly according to claim 14, wherein the conductive fixing member precursor layer is formed on the base including the top surface of the wiring in step (A), the method further including a step of:

leaving a portion of the conductive fixing member layer located under the light-emitting element by removing other portions of the conductive fixing member layer, the step being performed after step (B).

16. The method of producing a light-emitting element assembly according to claim 14, wherein, in step (B), the light-emitting element is arranged on the wiring by removing the light-emitting element from a substrate in a state in which the connecting portion provided on the light-emitting element supported on the substrate is in contact with the conductive fixing member precursor layer.

17. The method of producing a light-emitting element assembly according to claim 14, wherein the conductive fixing member precursor layer does not contain fine particles having a particle diameter exceeding $1 \times 10^{-7}$ m.

18. The method of producing a light-emitting element assembly according to claim 14, wherein the conductive fixing member layer is made of ITO or IZO.

19. The method of producing a light-emitting element assembly according to claim 14, wherein, by performing a heat treatment during step (B) or after step (B), a metal constituting the wiring and a metal constituting the conductive fixing member layer are alloyed, a metal constituting the connecting portion of the light-emitting element and a metal constituting the conductive fixing member layer are alloyed, or a metal constituting the wiring and a metal constituting the conductive fixing member layer are alloyed and a metal constituting the connecting portion of the light-emitting element and a metal constituting the conductive fixing member layer are alloyed.

20. The method of producing a light-emitting element assembly according to claim 19, wherein a metal layer for alloying is formed in an area of a projection image of the light-emitting element that is vertically projected on the base.

21. A method of producing a light-emitting element assembly comprising:

(A) forming a conductive fixing member precursor layer on a connecting portion provided on a light-emitting element; and (B) arranging the light-emitting element on wiring provided on a base such that the conductive fixing member precursor layer contacts the wiring, and then heating the conductive fixing member precursor layer to form a conductive fixing member layer, thereby fixing the connecting portion of the light-emitting element to the wiring, with the conductive fixing member layer therebetween, wherein the conductive fixing member precursor layer is composed of a solution-type conductive material.

22. The method of producing a light-emitting element assembly according to claim 21, wherein, in step (B), the light-emitting element is arranged on the wiring by removing the light-emitting element from a substrate in a state in which the conductive fixing member precursor layer formed on the connecting portion provided on the light-emitting element supported on the substrate is in contact with the wiring provided on the base.

23. The method of producing a light-emitting element assembly according to claim 21, wherein the conductive fixing member precursor layer does not contain fine particles having a particle diameter exceeding $1 \times 10^{-7}$ m.

24. The method of producing a light-emitting element assembly according to claim 21, wherein the conductive fixing member layer is made of ITO or IZO.

25. The method of producing a light-emitting element assembly according to claim 21, wherein, by performing a heat treatment during step (B) or after step (B), a metal constituting the wiring and a metal constituting the conductive fixing member layer are alloyed, a metal constituting the connecting portion of the light-emitting element and a metal constituting the conductive fixing member layer are alloyed, or a metal constituting the wiring and a metal constituting the conductive fixing member layer are alloyed and a metal constituting the connecting portion of the light-emitting element and a metal constituting the conductive fixing member layer are alloyed.

26. The method of producing light-emitting element assembly according to claim 25, wherein a metal layer for alloying is formed in an area of a projection image of the light-emitting element that is vertically projected on the base.

* * * * *